(12) United States Patent
Kim et al.

(10) Patent No.: US 12,346,573 B2
(45) Date of Patent: Jul. 1, 2025

(54) SEMICONDUCTOR MEMORY DEVICE AND METHODS OF OPERATION

(71) Applicant: Samsung Electronics Co., Ltd., Suwon-si (KR)

(72) Inventors: Kiheung Kim, Suwon-si (KR); Taeyoung Oh, Seoul (KR); Hyeran Kim, Uiwang-si (KR); Sungyong Cho, Anyang-si (KR); Kyungsoo Ha, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 54 days.

(21) Appl. No.: 18/076,628

(22) Filed: Dec. 7, 2022

(65) Prior Publication Data

US 2023/0185460 A1 Jun. 15, 2023

(30) Foreign Application Priority Data

Dec. 9, 2021 (KR) .......................... 10-2021-0175853
Mar. 14, 2022 (KR) .......................... 10-2022-0031219

(51) Int. Cl.
*G06F 3/06* (2006.01)

(52) U.S. Cl.
CPC .......... *G06F 3/0619* (2013.01); *G06F 3/0653* (2013.01); *G06F 3/0659* (2013.01); *G06F 3/0673* (2013.01)

(58) Field of Classification Search
CPC .............. G11C 29/12; G11C 2207/002; G11C 11/4078; G11C 11/4096; G11C 11/40622;

(Continued)

(56) References Cited

U.S. PATENT DOCUMENTS 8,498,160 B2 * 7/2013 Kim .................... G11C 11/5628
365/185.25
9,032,141 B2 * 5/2015 Bains .................. G06F 13/1636
711/106

(Continued)

FOREIGN PATENT DOCUMENTS

KR 10-1731508 B1 5/2017

OTHER PUBLICATIONS

European search report dated Jun. 28, 2023 from the European Patent Office for European Patent Application No. 22194227.9.

*Primary Examiner* — Khamdan N. Alrobaie
(74) *Attorney, Agent, or Firm* — Muir Patent Law, PLLC

(57) ABSTRACT

A semiconductor memory device includes a memory cell array, a row hammer management circuit and a control logic circuit. The memory cell array includes a plurality of memory cell rows. The row hammer management circuit counts the number of instances of access of each of the memory cell rows, such as in response to the receipt of an active command, to store the counted values in count cells of each of the memory cell rows as count data and, in response to a first command, initiates an internal read-update-write operation to read the count data, to update the read count data, and to write the updated count data in the count cells. The control logic circuit may performs an internal write operation to write the updated count data in the count cells during a second write time interval that is smaller than a first write time interval associated with a normal write operation.

20 Claims, 34 Drawing Sheets

(58) Field of Classification Search
CPC ..... G11C 29/42; G11C 11/401; G11C 11/406; G06F 3/0619; G06F 3/0653; G06F 3/0659; G06F 3/0673
See application file for complete search history.

(56) References Cited

U.S. PATENT DOCUMENTS

| | | |
|---|---|---|
| 9,384,821 B2 | 7/2016 | Bains et al. |
| 9,685,240 B1 | 6/2017 | Park |
| 9,721,643 B2 | 8/2017 | Bains et al. |
| 9,911,505 B2 | 3/2018 | Jung et al. |
| 10,083,737 B2 | 9/2018 | Bains et al. |
| 10,636,476 B2 | 4/2020 | Nale |
| 10,817,371 B2 | 10/2020 | Rooney et al. |
| 10,825,534 B2 | 11/2020 | Nale |
| 2013/0304982 A1 | 11/2013 | Jung et al. |
| 2014/0177376 A1 | 6/2014 | Song |
| 2017/0271026 A1* | 9/2017 | Park ......................... G11C 7/24 |
| 2020/0251158 A1* | 8/2020 | Shore .................... G11C 11/407 |
| 2021/0049269 A1 | 2/2021 | Ghosh et al. |
| 2021/0365316 A1* | 11/2021 | Nale ................. G11C 11/40611 |
| 2023/0393770 A1* | 12/2023 | Lu ......................... G06F 3/0679 |
| 2023/0420033 A1* | 12/2023 | Kim ..................... G11C 7/1063 |
| 2024/0038292 A1* | 2/2024 | Kim ................... G11C 11/4085 |

\* cited by examiner

FIG. 16

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CA11 | CA12 | CA13 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

FIG. 17

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| WRA | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | AP | L | V | CID3 |
| RDA | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | AP | V | V | CID3 |

FIG. 18

| CMD | CS_n | CA0 | CA1 | CA2 | CA3 | CA4 | CA5 | CA6 | CA7 | CA8 | CA9 | CA10 | CA11 | CA12 | CA13 |
|-----|------|-----|-----|-----|-----|-----|-----|-----|-----|-----|-----|------|------|------|------|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | h | CID3 | BA0 | BA1 | BG0 | BG1 | BG2 | CID0 | CID1 | CID2 |

SEMICONDUCTOR MEMORY DEVICE AND METHODS OF OPERATION

CROSS-REFERENCE TO RELATED APPLICATIONS

This application claims the benefit of priority under 35 USC § 119 to Korean Patent Application No. 10-2021-0175853, filed on Dec. 9, 2021 and to Korean Patent Application No. 10-2022-0031219, filed on Mar. 14, 2022, in the Korean Intellectual Property Office, the disclosure of each of which is incorporated by reference herein in its entirety.

BACKGROUND

The present disclosure relates to memories and methods of operating the same, and more particularly to semiconductor memory devices to perform a hammer refresh operation.

Semiconductor memory devices may be classified as a volatile memory device or a nonvolatile memory device. A volatile memory device refers to a memory device that loses data stored therein when powered-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharge state (i.e., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost so that data stored in the memory cells is not corrupted and/or lost.

SUMMARY

Example embodiments may provide a semiconductor memory device and methods of operating the same to manage row hammer of all of a plurality of memory cell rows while maintaining performance.

According to example embodiments, a semiconductor memory device includes a memory cell array, a row hammer management circuit and a control logic circuit. The memory cell array includes a plurality of memory cell rows, and each of the plurality of memory cell rows includes a plurality of memory cells. The row hammer management circuit counts the number of instances of access associated with each of the plurality of memory cell rows, such as in response to an active command from an external memory controller, and stores the counted values in count cells of each of the plurality of memory cell rows as count data. The row hammer management circuit initiates an internal read-update-write operation to read the count data from the count cells of a target memory cell row from among the plurality of memory cell rows, to update the read count data, and to write the updated count data in the count cells of the target memory cell row. The control logic circuit controls the row hammer management circuit, performs a normal write operation to write data in normal cells in each of the plurality of memory cell rows during a first write time interval and performs an internal write operation to write the updated count data in the count cells during a second write time interval that is smaller than the first write time interval.

According to example embodiments, the row hammer management circuit performs an internal read-update-write operation in response to a flag received with a first command that is applied to the memory device after receipt of the active command.

According to example embodiments, the control logic circuit performs an internal read-update-write operation during the second write time interval by performing on or more of: performing a voltage boosting operation to increase at least one of a level and an activation interval of voltages associated with the internal write operation to be more than the corresponding one of a level and an activation interval of voltages associated with the normal write operation; assigning memory cells with a shorter write time from among the memory cells of each of the memory cell row as the count cells based on a result of a testing write characteristic of the memory cells of each of the plurality of memory cell rows; and controlling an ECC engine such that a first ratio of the number of bits of first parity data based on the data to the number bits of the data is smaller than a second ratio of the number of bits of count parity data based on the count data to the number of bits of the count data.

Accordingly, the semiconductor memory device and related methods of operation according to example embodiments, may store an active count of each of a plurality of memory cell rows in count cells of each of the plurality of memory cell rows as the count data, and may update the count data based on a subsequent command which is applied after the active command while writing the updated counted values in the count cells during a second write time interval smaller than a first write time interval during which the semiconductor memory device writes data in normal cells of the target memory cell row. Therefore, the semiconductor memory device and the memory system may manage row hammer of all of the memory cell rows while maintaining performance.

BRIEF DESCRIPTION OF THE DRAWINGS

Example embodiments will be described below in more detail with reference to the accompanying drawings.

FIGS. 16 through 18 illustrate example commands which may be used in the memory system of FIG. 1.

DETAILED DESCRIPTION

Various example embodiments will be described more fully hereinafter with reference to the accompanying drawings, in which example embodiments are shown.

Figure 1:
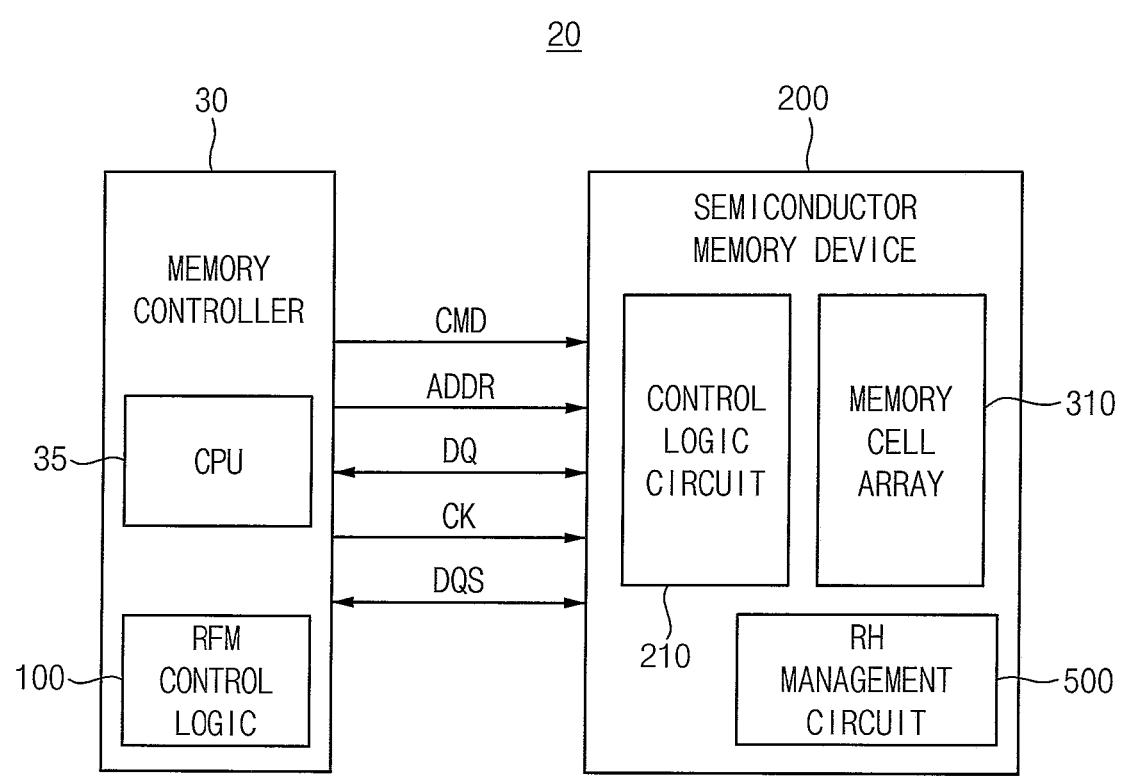
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and a semiconductor memory device 200.

The memory controller 30 may control overall operation of the memory system 20. The memory controller 30 may control overall data exchange between an external host (not shown) to which it is connected and the semiconductor memory device 200. For example, the memory controller 30 may write data to the semiconductor memory device 200 or read data from the semiconductor memory device 200 in response to a corresponding request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), a DDR6 SDRAM, or the like. Both memory controller 30 and the semiconductor memory device 200 may be a semiconductor chip. In some embodiments one or both of the memory controller 30 and semiconductor memory device 200 may be formed as two or more semiconductor chips (e.g., stacked together or separately positioned chips in a package).

The memory controller 30 transmits a clock signal CK (the clock signal CK may be referred to a command clock signal), a command CMD, and an address ADDR to the semiconductor memory device 200. Herein, for convenience of description, descriptions regarding a clock signal CK, a command CMD, and an address ADDR may also apply to their plural forms (clock signals CK, commands CMD, and addresses ADDR) and these terms may be used interchangeably. The memory controller 30 may transmit a data strobe signal DQS to the semiconductor memory device 200 when the memory controller 30 writes data DQ the semiconductor memory device 200. The semiconductor memory device 200 may transmit a data strobe signal DQS to the memory controller 30 when the memory controller 30 reads data DQ from the semiconductor memory device 200. The address ADDR may be accompanied by the command CMD and the address ADDR may be referred to as an access address.

The memory controller 30 may include a central processing unit (CPU) 35 that controls overall operation of the memory controller 30 and a refresh management (RFM) control logic circuit 100 that generates an RFM command associated with a row hammer of a row of the plurality of memory cell rows.

The semiconductor memory device 200 may include a memory cell array 310 that stores the data signal DQ, a control logic circuit 210 and a row hammer (RH) management circuit 500.

The control logic circuit 210 may control operations of the semiconductor memory device 200, such as performing memory access (e.g., read, write, etc.) operations in response to commands received from the memory controller 30. The memory cell array 310 may include a plurality of memory cell rows and each of the memory cell rows may include a plurality of memory cells, such as volatile memory cells.

The row hammer management circuit 500 may count the number of times of access of each of the plurality of memory cell rows, such as, for each memory cell row, counting the number of active commands received from the memory controller 30 corresponding the memory cell row, and store these counted values in count cells of each of the plurality of memory cell rows as count data. Based on the counted values, the row hammer management circuit 500 may determine a hammer address identifying at least one of the plurality of memory cell rows which is/are intensively accessed. Herein, the terms "intensively accessed" may mean that a particular memory cell row that has been accessed equal to or more than a reference number of times (e.g., NTH shown in FIG. 5A) and/or accessed equal to or more than a reference number of times within a predetermined time period. For example, the count data may indicate how many times a memory cell row has been accessed since the most recent refresh operation(s) of neighboring rows, such as reflecting a number of times of access within a time period no greater than the refresh window (tREFW) of the memory cell rows (the time period in which the memory cell rows should be regularly refreshed). In some examples, after a refresh operation of a memory cell row and/or or its adjacent memory cell rows, the count data of that memory cell row may be reset to zero, such as by performing an internal write operation to store a count value of zero in the count cells of the memory cell row.

In response to a subsequent command such as an active count update command or a precharge command applied after the active command, the row hammer management circuit 500 may perform an internal read-update-write operation, to read the count data (e.g., via an internal read operation) from the count cells of a target memory cell row from among the plurality of memory cell rows, to update the read count data, and to write the updated count data (e.g., via an internal write operation) in the count cells of the target memory cell row. In some examples, internal access operations (e.g., internal read, internal write, internal read-update-write) of the semiconductor memory device 200 may refer to the access of data that is not communicated with a source outside the memory device. For example, data read and written during an internal read-update-write operation may not be transmitted outside of the semiconductor memory device 200 (e.g., the data is not provided to the semiconductor memory device 200 by memory controller 30 nor transmitted by the semiconductor memory device 200 to the memory controller 30) as part of this internal read-update-write operation.

The row hammer management circuit 500 may update the counted values stored in the target memory cell row in response to the subsequent command. The active count update command may be a dedicated command for designating the internal read-update-write operation, which is applied to the semiconductor memory device 200 after a read command or a write command on the target memory cell row and before precharging the target memory cell row.

The control logic circuit 210 may perform a normal write operation to write data in a group of cells (other than the count cells) in each of the plurality of memory cell rows during a first write time interval and may perform an internal write operation to write the updated count data in the count cells during a second write time interval smaller than the first write time interval. It should be appreciated that the term "normal" is used in several different contexts in this disclosure that may be unrelated to each other. For example, a normal write operation refers to a typical write operation, such as one in which the memory controller 30 provides data to the memory device 200 to be written. During a normal write operation, data may be written to "normal" memory cells or, alternatively, written to redundant memory cells (e.g., memory cells that have replaced normal memory cells that have been identified as defective).

In an embodiment, the row hammer management circuit 500 may initiate the internal read-update-write operation in response to receipt of a flag from the memory controller 30 (such as a flag received with a precharge command which is applied to the semiconductor memory device 200). For example, after receipt of such a flag, the internal read-update-write operation may be performed after the active command and the control logic circuit 210 operate to precharge the target memory cell row.

In example embodiments, the row hammer management circuit 500 may perform the internal read-update-write operation before precharging the target memory cell row in response to either a read command including an auto precharge or a write command including an auto precharge which is selectively applied after the active command is applied.

The semiconductor memory device 200 performs a refresh operation periodically (e.g., once every refresh period) due to charge leakage of memory cells storing data. Due to scale down of the manufacturing process of the semiconductor memory device 200, the storage capacitance of the memory cell is decreased and the refresh period is shortened. In addition, the entire refresh time to refresh all memory cells of the semiconductor memory device 200 is increased as the memory capacity of the semiconductor memory device 200 is increased.

To compensate for degradation of adjacent memory cells due to the intensive access to a particular row or a hammer address, a target row refresh (TRR) scheme may be adopted and an in-memory refresh scheme may be implemented to reduce the burden of the memory controller.

The memory controller may control the hammer refresh operation in the TRR scheme (e.g., identify hammer address(es) for refresh and control timing of initiating the refresh of the corresponding rows) and the semiconductor memory device may control the hammer refresh operation in the in-memory refresh scheme (e.g., identify hammer address(es) for refresh and control timing of initiating the refresh of the corresponding rows).

The chip size overhead for the in-memory refresh may be problematic as the memory capacity is increased and demands on low power consumption of the semiconductor memory device is increased. In addition, the power consumption may be increased because the semiconductor memory device has to monitor for potential the hammer refresh operations even when there is no intensive access to rows of the memory device 200. In addition, it is necessary to manage a row hammer of some of the memory cell rows of the plurality of memory cell rows as they occur.

In the memory system 20 according to example embodiments, the row hammer management circuit 500 counts the number of times of access associated with each of the plurality of memory cell rows to store the counted values in the count cells of each of the plurality of memory cell rows as count data and may manage the row hammer of all of the memory cell rows based on the counted values while reducing write time corresponding to a time interval during which the row hammer management circuit 500 writes back the counted value in the count cells.

Figure 2:
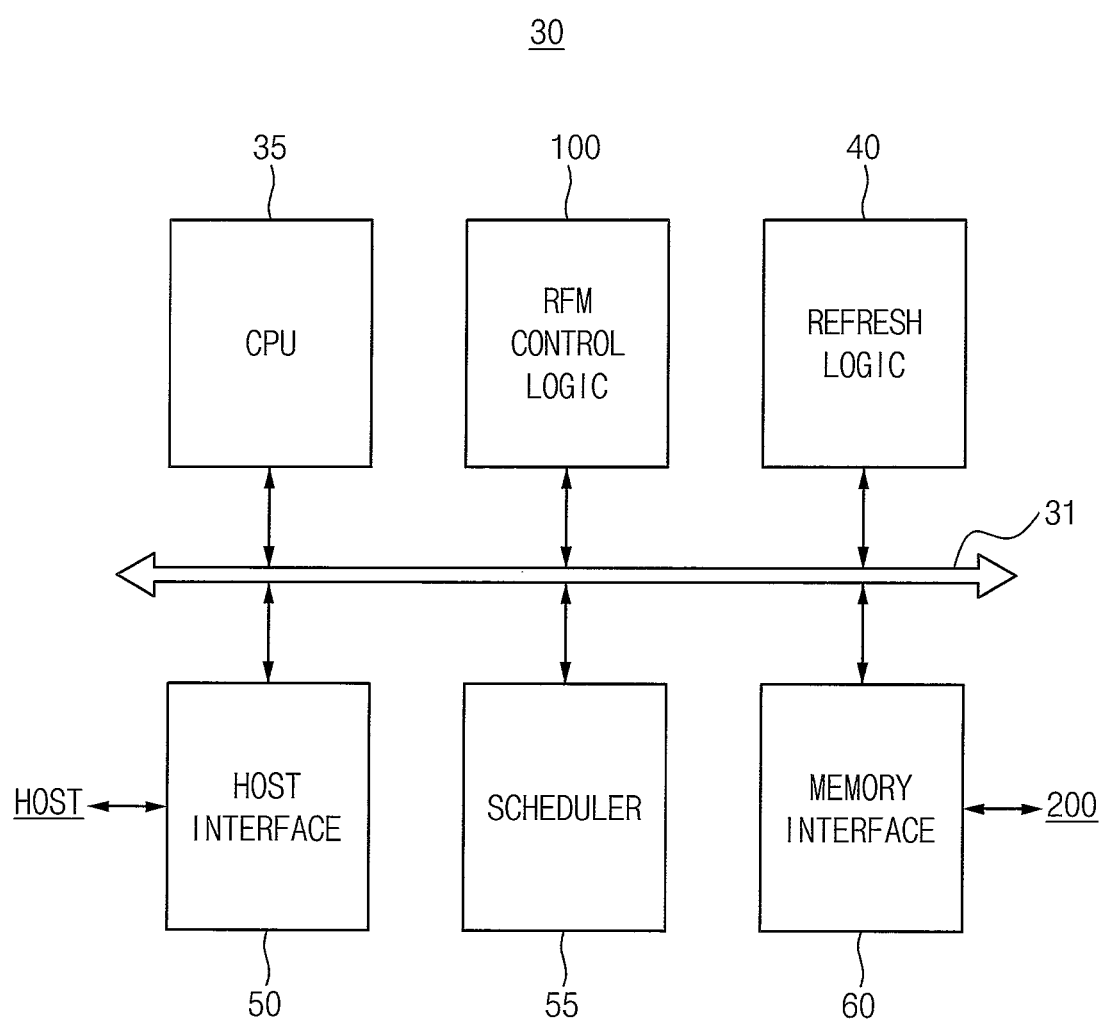
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include a central processing unit (CPU) 35, the RFM control logic circuit 100, a refresh logic circuit 40, a host interface 50, a scheduler 55 and a memory interface 60 which are connected to each other through a bus 31.

The CPU 35 may control overall operation of the memory controller 30. The CPU 35 may control the RFM control logic circuit 100, the refresh logic circuit 40, the host interface 50, the scheduler 55 and the memory interface 60 through the bus 31.

The refresh logic circuit 40 may generate auto refresh command for refreshing memory cells of the plurality of memory cell rows based on a refresh interval of the semiconductor memory device 200.

The host interface 50 may interface with a host. The memory interface 60 may interface with the semiconductor memory device 200.

The scheduler 55 may manage scheduling and transmission of sequences of commands generated in the memory controller 30. The scheduler 55 may transmit the active command and subsequent commands to the semiconductor memory device 200 via the memory interface 60 and the semiconductor memory device 200 may update the active count of each of the memory cell rows to monitor and manage the row hammer of all of the memory cell rows.

Figure 3:
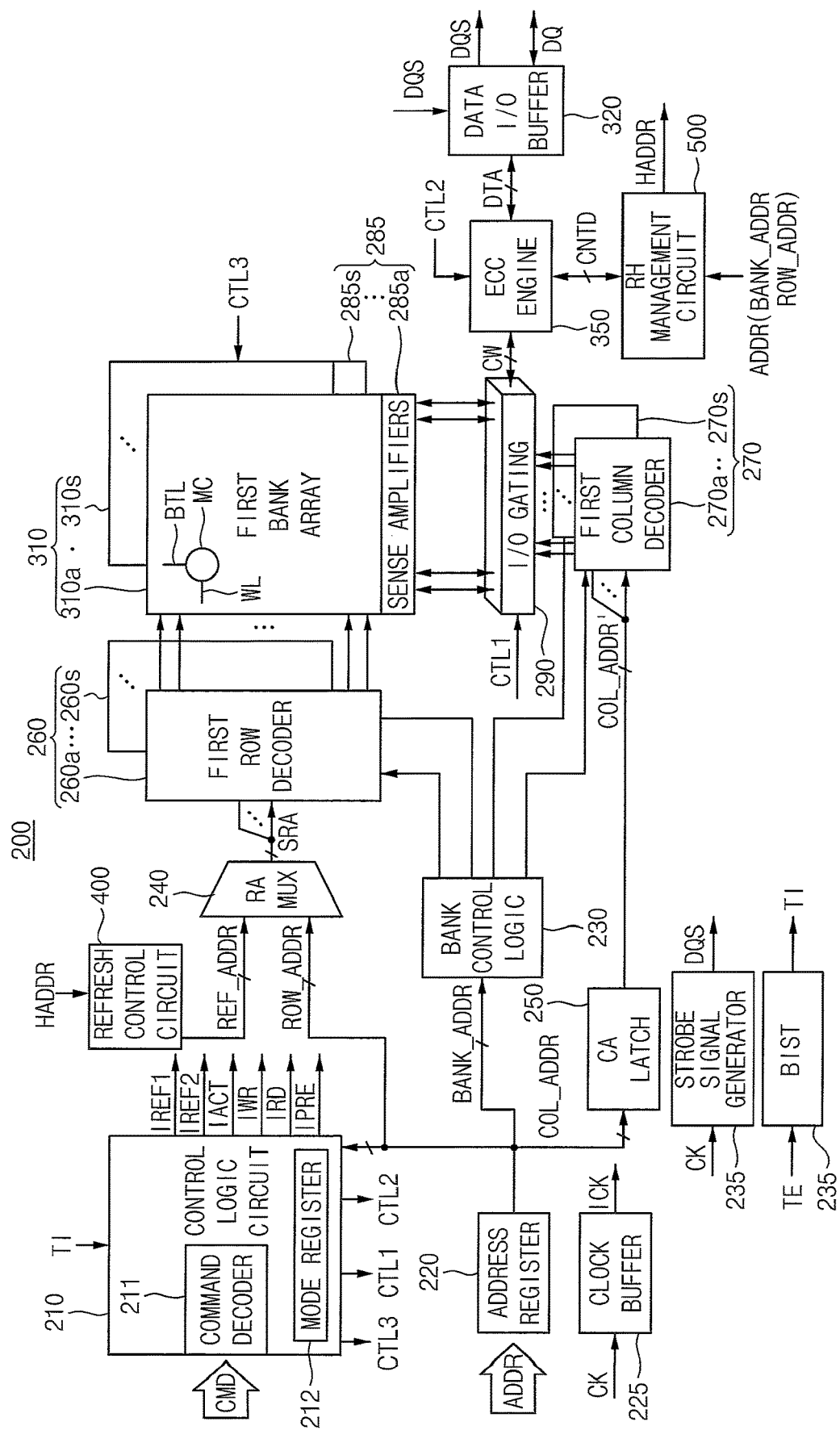
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments.

Referring to FIG. 3, the semiconductor memory device 200 may include the control logic circuit 210, an address register 220, a bank control logic circuit 230, a built-in self-test (BIST) circuit 237, a refresh control circuit 400, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, the row hammer management circuit 500 and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifier arrays 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifier arrays 285a~285s may form first through sixteenth banks. Each of the first through sixteenth bank arrays 310a~310s includes a plurality of memory cells MC formed at intersections of a plurality of word-lines WL and a plurality of bit-lines BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a selected row address SRA. The selected row address SRA that is output from the row address multiplexer 240 is applied to the first through sixteenth row decoders 260a~260s.

The refresh control circuit 400 may sequentially increase or decrease the refresh row address REF_ADDR (e.g., increment the refresh row address with a counter) in a normal refresh mode in response to first and second refresh control signals IREF1 and IREF2 from the control logic circuit 210. The refresh control circuit 400 may receive a hammer address HADDR in a hammer refresh mode, and may output one or more hammer refresh row addresses designating one or more victim memory cell rows physically adjacent to a memory cell row corresponding to the hammer address as the refresh row address REF_ADDR. In general, victim memory cell rows may be those rows that are immediately adjacent to the memory cell row corresponding to the hammer address, each row or each contiguous section of memory cell rows immediately adjacent to the memory cell row corresponding to the hammer address on each side of the memory cell row corresponding to the hammer address.

The activated one of the first through sixteenth row decoders 260a~260s (as activated by selection by the bank control logic circuit 230 in response to the corresponding bank address BANK_ADDR) may decode the selected row address SRA that is output from the row address multiplexer 240, and may activate a word-line corresponding to the selected row address SRA. For example, the activated bank row decoder applies a word-line driving voltage to the word-line corresponding to the selected row address SRA.

The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270s.

The activated one of the first through sixteenth column decoders 270a~270s (as activated by selection by the bank control logic circuit 230 in response to the corresponding bank address BANK_ADDR) activates sense amplifiers corresponding to the column address COL_ADDR through the I/O gating circuit 290.

The I/O gating circuit 290 may include a circuitry for gating input/output data, and may further include input data mask logic, read data latches for storing a codeword that is output from the first through sixteenth bank arrays 310a~310s, and write drivers for writing data to the first through sixteenth bank arrays 310a~310s.

Codeword CW (e.g., read codeword RCW in FIG. 14) read from a selected one bank array of the first through sixteenth bank arrays 310a~310s is sensed by sense amplifiers coupled to the selected one bank array from which the data is to be read, and is stored in the read data latches. The codeword CW stored in the read data latches may be provided to the data I/O buffer 320 as data DTA (e.g., corrected data C_DTA in FIG. 12) after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected one bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform an ECC encoding on the data DTA and may perform an ECC decoding on the codeword CW based on a second control signal CTL2 from the control logic circuit 210. The ECC engine 350 may perform an ECC encoding and an ECC decoding on count data CNTD provided from the row hammer management circuit 500 based on the second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the memory controller 30.

The BIST circuit 237 may test write characteristic of memory cells of each of the plurality of memory cell rows by unit of column selection line (CSL) in response to a test enable signal TE and may provide the control logic circuit 210 with a result of the test as test information TI. The control logic circuit 210 may assign memory cells with shorter write time from among the memory cells as the count cells based on the test information TI.

The control logic circuit 210 may control operations of the semiconductor memory device 200. For example, the control logic circuit 210 may generate control signals for the semiconductor memory device 200 in order to perform a write operation, a read operation, a normal refresh operation and a hammer refresh operation. The control logic circuit 210 includes a command decoder 211 that decodes the command CMD received from the memory controller 30 and a mode register 212 that sets an operation mode of the semiconductor memory device 200.

For example, the command decoder 211 may generate the control signals corresponding to the command CMD by decoding signals provided to the memory device 200 by the memory controller 30, such as a write enable signal, a row address strobe signal, a column address strobe signal, a chip select signal, etc. The control logic circuit 210 may provide a first control signal CTL1 to the I/O gating circuit and the second control signal CTL2 to the ECC engine 350 and a third control signal CTL3 to the memory cell array 310. In addition, the command decoder 211 may generate internal command signals including the first refresh control signal IREF1, the second refresh control signal IREF2, an active signal TACT, a precharge signal IPRE, a read signal IRD and a write signal IWR by decoding the appropriate command CMD corresponding to such internal command signals.

Figure 4:
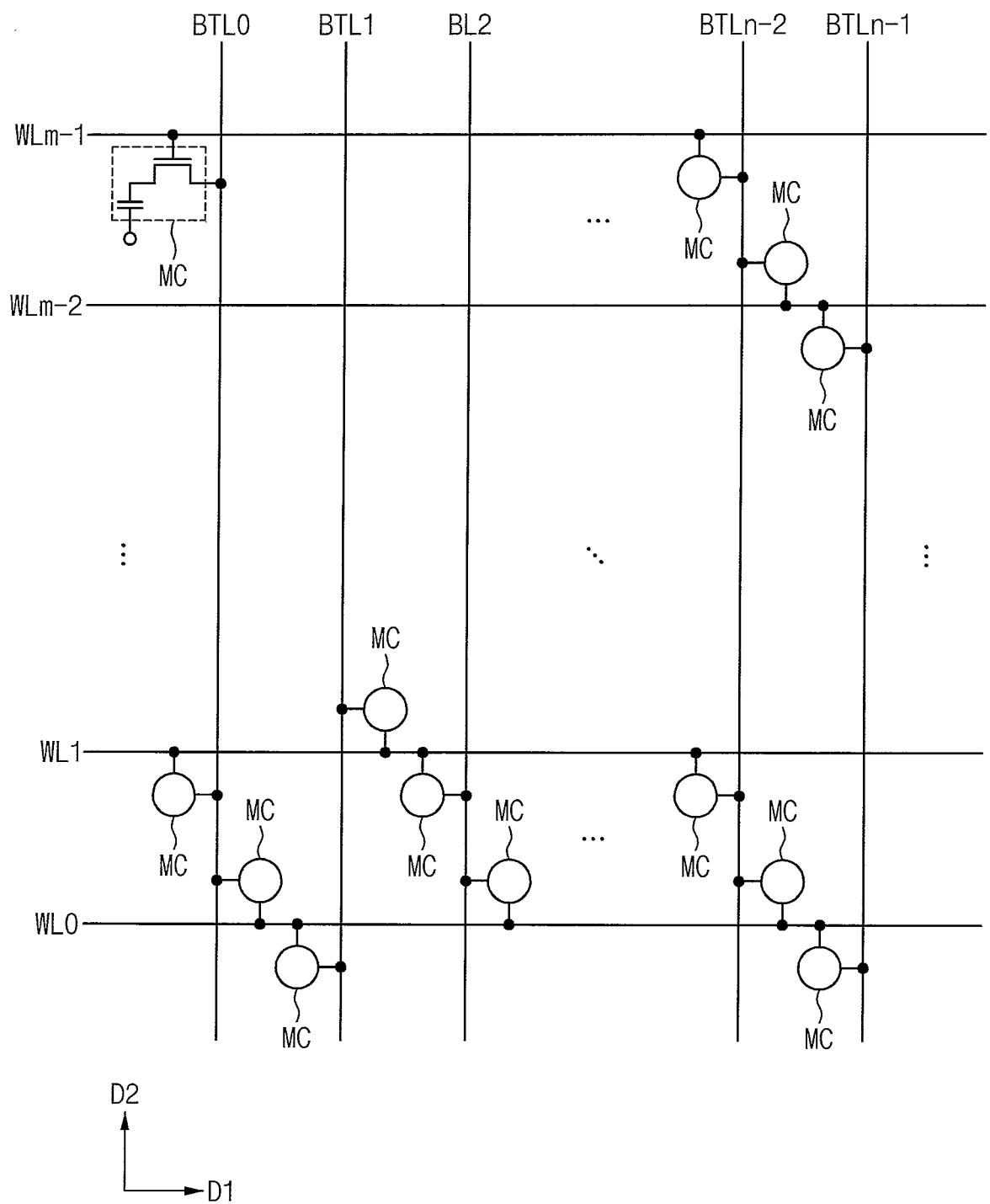
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a includes a plurality of word-lines WL0~WLm−1 (m is a natural number equal to or greater than two), a plurality of bit-lines BTL0~BTLn−1 (n is a natural number equal to or greater than two), and a plurality of memory cells MCs disposed at intersections between the word-lines WL0~WLm−1 and the bit-lines BTL0~BTLn−1. Each of the memory cells MCs includes a cell transistor having a gate coupled to each of the word-lines WL0~WLm−1, a first source/drain coupled each of the bit-lines BTL0~BTLn−1 and a second source/drain coupled to a cell capacitor of the memory cell MC. Each of the memory cells MCs may have a DRAM cell structure. Each of the word-lines WL0~WLm−1 extends in a first direction D1 and each of the bit-lines BTL0~BTLn−1 extend in a second direction D2 crossing the first direction D1.

The word-lines WL0~WLm−1 coupled to the plurality of memory cells MCs correspond to rows of the first bank array 310a and the bit-lines BTL0~BTLn−1 coupled to the plurality of memory cells MCs correspond to columns of the first bank array 310a.

Figure 5A:
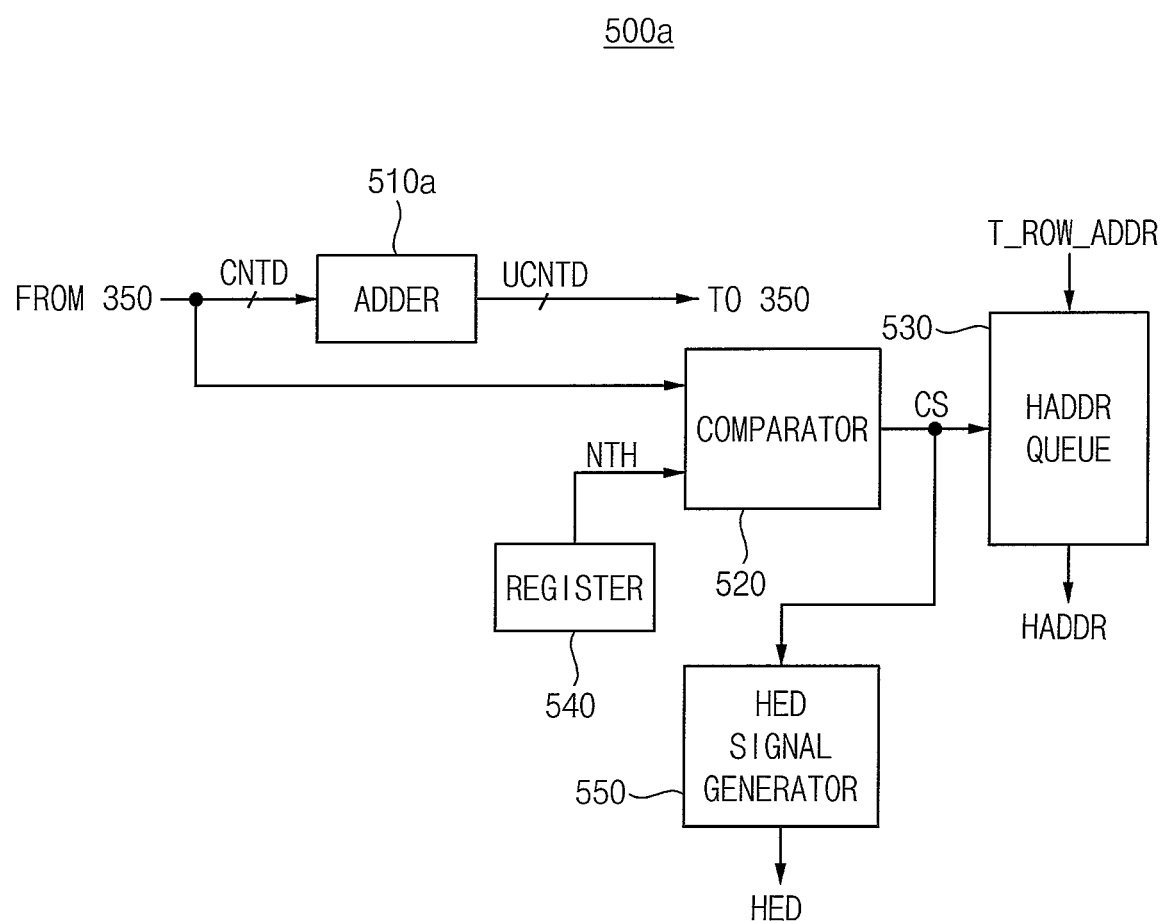
FIG. 5A is a block diagram illustrating an example of the row hammer management circuit in the semiconductor memory device of FIG. 3 according to example embodiments.

FIG. 5A is a block diagram illustrating an example of the row hammer management circuit in the semiconductor memory device of FIG. 3 according to example embodiments.

Referring to FIG. 5A, a row hammer management circuit 500a may include an adder 510a, a comparator 520, a hammer address queue 530, a register 540 and a hammer event detection (HED) signal generator 550.

The adder 510a updates the read count data CNTD read from the count cells of the target memory cell row to provide an updated count data UCNTD by increase the count data CNTD by one. The read count data CNTD read from the count cells of the target memory cell row may be provided from the ECC engine 350 after an ECC decoding operation is performed on the read count data CNTD. The adder 510a may update the read count data CNTD (e.g., by incrementing the read count data CNTD by one to provide updated count data UCNTD). The adder 510a may be implemented with an up-counter.

The updated count data UCNTD is provided to the ECC engine 350 and the ECC engine 350 performs an ECC encoding operation on the updated count data UCNTD prior to it being written back to the target memory cell row as count data.

The register 540 may store a reference number of times or a reference number NTH. For example, the reference number NTH may be predetermined (such as set during manufacturing or by programming via a mode register set command from the memory controller 30). The comparator 520 may compare the read count data CNTD with the reference number NTH to output a comparison signal CS indicating a result of the comparison. In alternative implementations, the comparator 520 may compare the updated count data UCNTD with the reference number NTH to output a comparison signal CS indicating a result of the comparison (remaining structure and operations may remain the same).

The hammer address queue 530 may store a target access address T_ROW_ADDR designating the target memory cell row in response to the comparison signal CS indicating that the read count data CNTD is equal to or greater than the reference number NTH and may provide the refresh control circuit 400 in FIG. 3 with the target access address T_ROW_ADDR as the hammer address HADDR.

The hammer event detection signal generator 550 may provide the refresh control circuit 400 in FIG. 3 with a hammer event detection signal HED indicating that a row hammer event has occurred, in response to the comparison signal CS indicating that the read count data CNTD is equal to or greater than the reference number NTH.

Figure 5B:
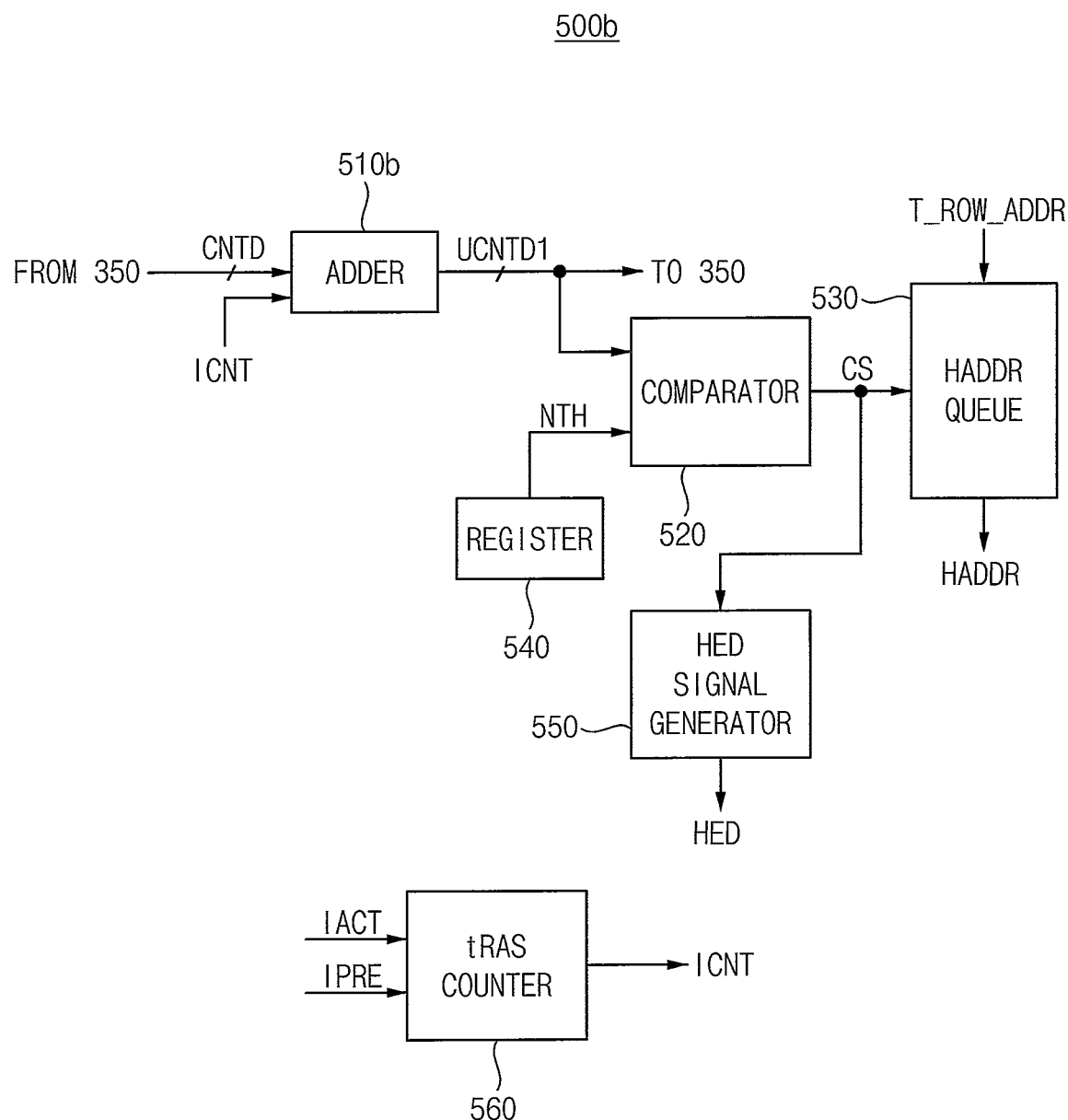
FIG. 5B is a block diagram illustrating an example of the row hammer management circuit in the semiconductor memory device of FIG. 3 according to example embodiments.

FIG. 5B is a block diagram illustrating an example of the row hammer management circuit in the semiconductor memory device of FIG. 3 according to example embodiments.

Referring to FIG. 5B, a row hammer management circuit 500b may include an adder 510b, a comparator 520, a hammer address queue 530, a register 540, a hammer event detection signal generator 550 and a (tRAS) counter 560.

The row hammer management circuit 500b of FIG. 5B differs from the row hammer management circuit 500a of FIG. 5A in that the row hammer management circuit 500b further includes the counter 560 and differs in an operation of the adder 510b.

The counter 560 may generate an interval counted value ICNT by starting a counting operation in response to receiving the active signal IACT and ending the counting operation in response to receiving the precharge signal IPRE and may provide the interval counting signal ICNT to the adder 510b. Therefore, the interval counted value ICNT may represent an activation time interval tRAS of the target memory cell row. That is, the counter 560 may count a time interval between the active command and the precharge command on the target memory cell row because the active signal IACT is associated with the active command and the precharge signal IPRE is associated with the precharge command.

The adder 510b may add the count data CNTD (read from the count cells of the target memory cell row that is provided by the ECC engine 350 after ECC decoding) and the interval counted value ICNT to provide updated count data UCNTD1. For example, the count data CNTD is provided to the ECC engine 350 after the read count data CNTD is read from the target memory cell row and the ECC decoding operation is performed on the read count data CNTD. Therefore, the updated count data UCNTD1 may reflect a total activation time of one or more intervals tRAS of the target memory cell row. The updated count data UCNTD1 is provided to the ECC engine 350 and the ECC engine 350 performs an ECC encoding operation on the updated count data UCNTD1 prior to it being written back to the target memory cell row as count data.

Therefore, the row hammer management circuit 500b may determine the hammer address HADDR by analysis of the total activation time of one or more intervals tRAS of the target memory cell row, and may prevent pass gate effect generated due to an enabled word-line (i.e., the target memory cell row).

Figure 6:
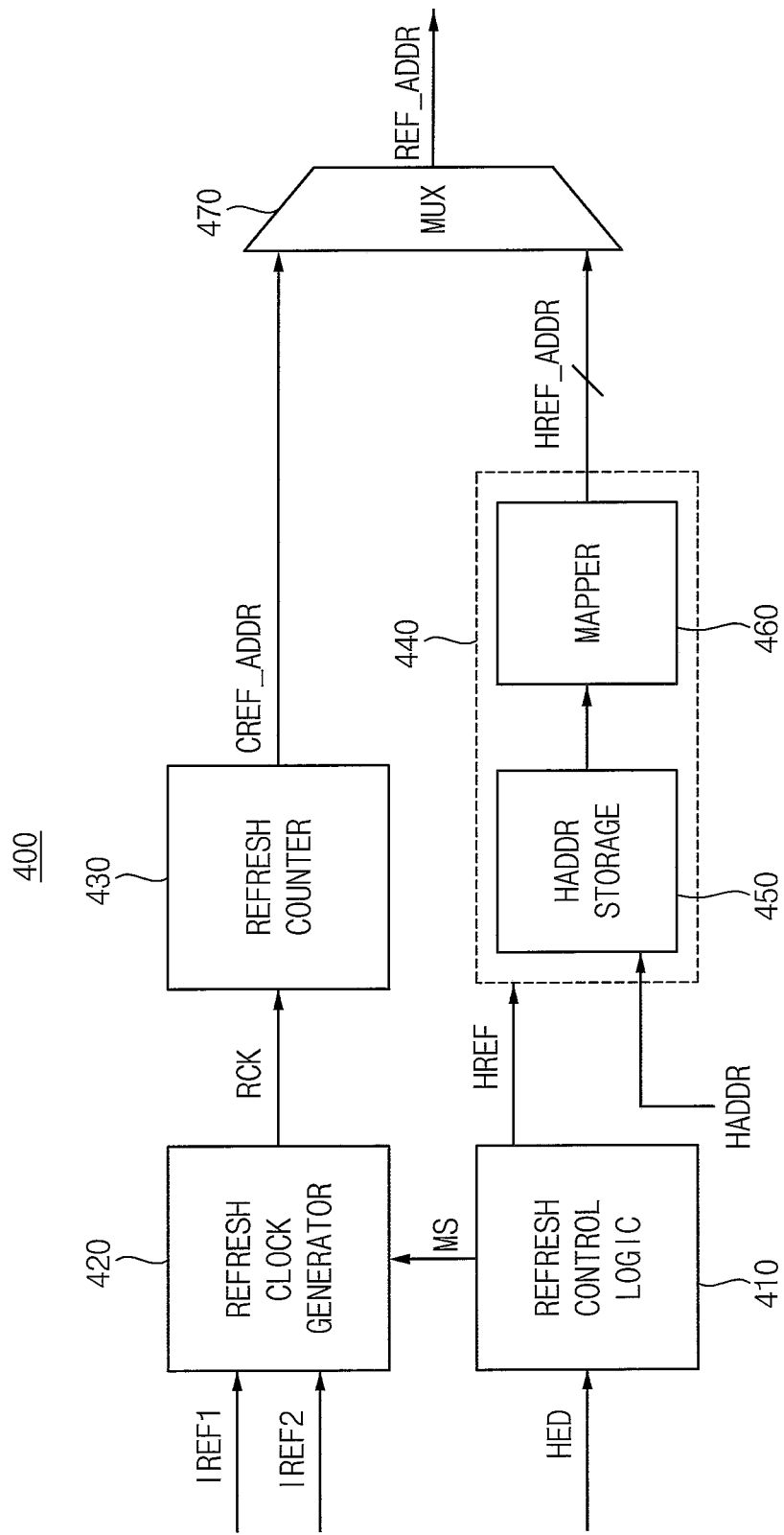
FIG. 6 is a block diagram illustrating an example of the refresh control circuit in FIG. 3 according to example embodiments.

FIG. 6 is a block diagram illustrating an example of the refresh control circuit in FIG. 3 according to example embodiments.

Referring to FIG. 6, the refresh control circuit 400 may include a refresh circuit 410, a refresh clock generator 420, a refresh counter 430 and a hammer refresh address generator 440.

The refresh control logic circuit 410 may provide a mode signal MS in response to the hammer event detection signal HED In addition, the refresh control logic circuit 410 may provide the hammer refresh address generator 440 with a hammer refresh signal HREF to control output timing of the hammer address in response to one of the first refresh control signal IREF1 and the second refresh control signal IREF2.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to the receiving the first refresh control signal IREF1 or during activation interval of the second refresh control signal IREF2.

The semiconductor memory device 200 may perform normal refresh operations in several different modes. For example, the memory controller 30 may provide an auto refresh command to the semiconductor memory device 200 to initiate refresh of one or more memory rows. For example, the memory controller 30 may provide a self-refresh entry command to cause the semiconductor memory device 200 to enter into a self-refresh mode in which the semiconductor memory device controls the timing and selection of the memory rows to be refreshed (until brought out of the self-refresh mode, such as by receiving a self-refresh exit commend). When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows to be refreshed by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address (HADDR) storage 450 and a mapper 460.

The hammer address storage 450 may store the hammer address HADDR and may output the hammer address HADDR to the mapper 460 in response to the hammer refresh signal HREF. The mapper 460 may generate one or more hammer refresh addresses HREF_ADDR designating one or more victim memory cell rows physically adjacent to a memory cell row corresponding to the hammer address HADDR.

The hammer refresh address generator 440 may provide the hammer refresh address HREF_ADDR as the refresh row address REF_ADDR to the row address multiplexer 240 in FIG. 3. Multiplexer 470 may select (e.g., based on the value of the hammer refresh signal HREF) one of the hammer refresh address HREF_ADDR and the counter refresh address CREF_ADDR to output as the refresh row address REF_ADDR FIG. 7 is a circuit diagram illustrating an example of the refresh clock generator shown in FIG. 6 according to example embodiments.

Figure 7:
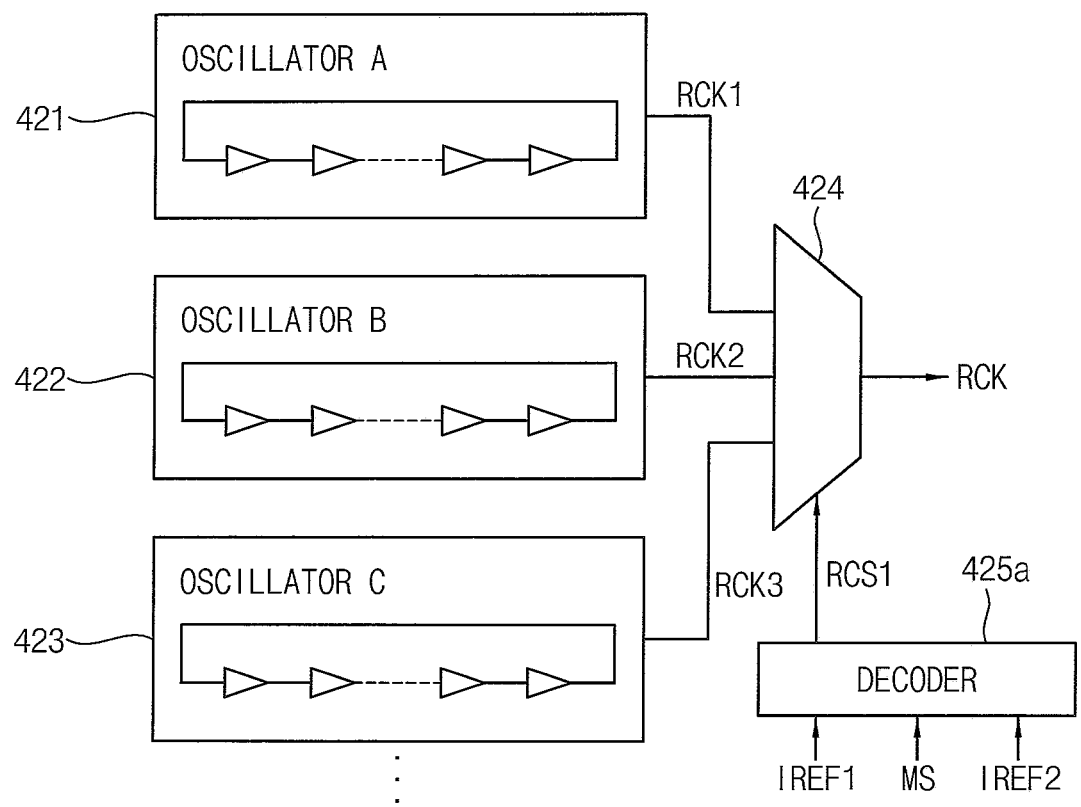
FIG. 7 is a circuit diagram illustrating an example of the refresh clock generator shown in FIG. 6 according to example embodiments.

Referring to FIG. 7, a refresh clock generator 420a may include a plurality of oscillators 421, 422 and 423, a multiplexer 424 and a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1.

For example, because the mode signal MS indicates that the row hammer event occurs, the refresh clock generator 420a may adjust a refresh cycle by selecting one of the refresh clock signals RCK1, RCK2 and RCK3.

Figure 8:
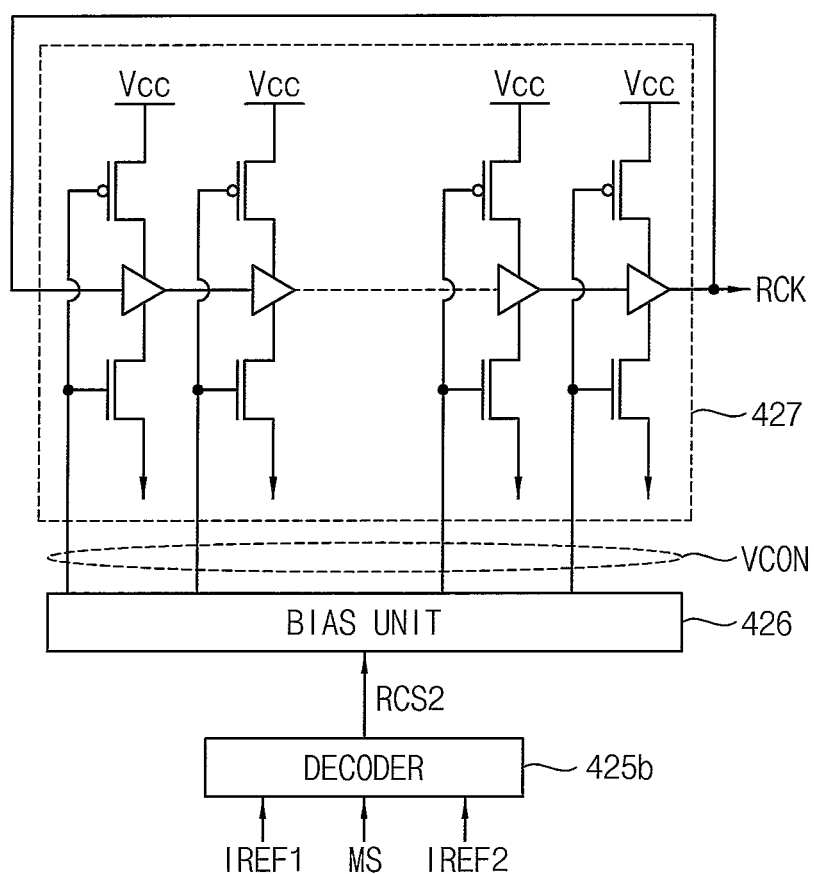
FIG. 8 is a circuit diagram illustrating another example of the refresh clock generator in FIG. 6 according to example embodiments.

FIG. 8 is a circuit diagram illustrating another example of the refresh clock generator in FIG. 6 according to example embodiments.

Referring to FIG. 8, a refresh clock generator 420b may include a decoder 425b, a bias unit 426 and an oscillator 427.

The oscillator 427 may include a plurality of buffers connected with a ring configuration, a plurality of p-channel metal-oxide semiconductor (PMOS) transistors and a plurality of n-channel metal-oxide semiconductor (NMOS) transistors. Each of the PMOS transistors may have a source coupled to a supply voltage Vcc a gate to receive a control voltage VCON and a drain coupled to each of the buffers. Each of the NMOS transistors may have a source coupled to each of the buffers, a gate to receive the control voltage VCON and a drain coupled to a ground voltage.

The decoder 425b may decode the first refresh control signal IREF1, the second refresh control signal IREF2 and the mode signal MS to output a clock control signal RCS2. The bias unit 426 generates the control voltage VCON in response to the clock control signal RCS2. The oscillator 427 generates the refresh clock signal RCK having a variable period, according to the control voltage VCON.

For example, because the mode signal MS indicates that the row hammer event occurs, the refresh clock generator 420b may adjust a refresh cycle by varying a period of the refresh clock signal RCK based on the clock control signal RCS2.

Figure 9:
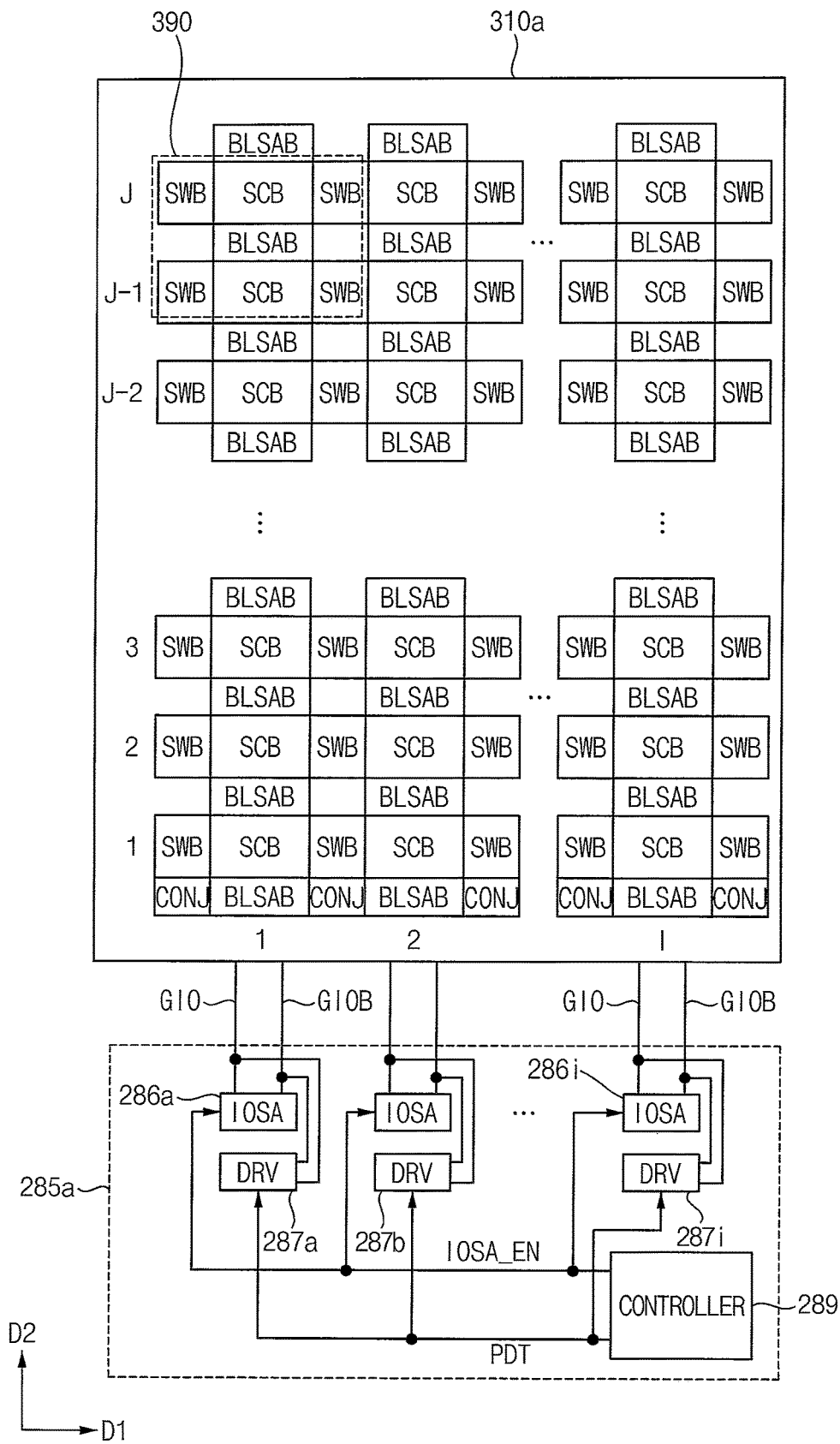
FIG. 9 illustrates an example of the first bank array in the semiconductor memory device of FIG. 3 according to some example embodiments.

FIG. 9 illustrates an example of the first bank array 310a in the semiconductor memory device of FIG. 3 according to some example embodiments. It will be appreciated that details of structure of one bank (such as the first bank array 310a) may also be representative of details of the same corresponding structure of the other banks.

Referring to FIG. 9, in the first bank array 310a, sub-array blocks SCB are arranged in a two-dimensional array, with I columns of sub-array blocks SCB disposed in the first direction D1, and J rows sub-array blocks SCB disposed in the second direction D2 perpendicular to the first direction D1. I and J represent a number of the columns sub-array blocks SCB in the first direction D1 and rows of the sub-array locks SCB in the second direction D2, respectively, and are natural numbers equal to or greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

The first sense amplifier array 285a may be disposed in the first direction D1 with respect to the first bank array 310a and the first sense amplifier array 285a may include I I/O sense amplifiers IOSAs 286a, 286b, ... 286i, I drivers DRVs 287a, 287b, ... 287i and a controller 289. Each of the I I/O sense amplifiers IOSAs 286a, 286b, ... 286i and each of the I drivers DRVs 287a, 287b, 287i may be connected to global I/O lines GIO and GIOB.

The controller 289 may control the I I/O sense amplifiers 286a, 286b, 286i and the I drivers 287a, 287b, ... 287i by providing an enable signal IOSA_EN to the I I/O sense amplifiers 286a, 286b, ... 286i in a read operation and by providing a driving signal PDT to the I drivers DRVs 287a, 287b, ... 287i in a write operation.

A portion 390 in the first bank array 310a will be described with reference to FIG. 10 below.

Figure 10:
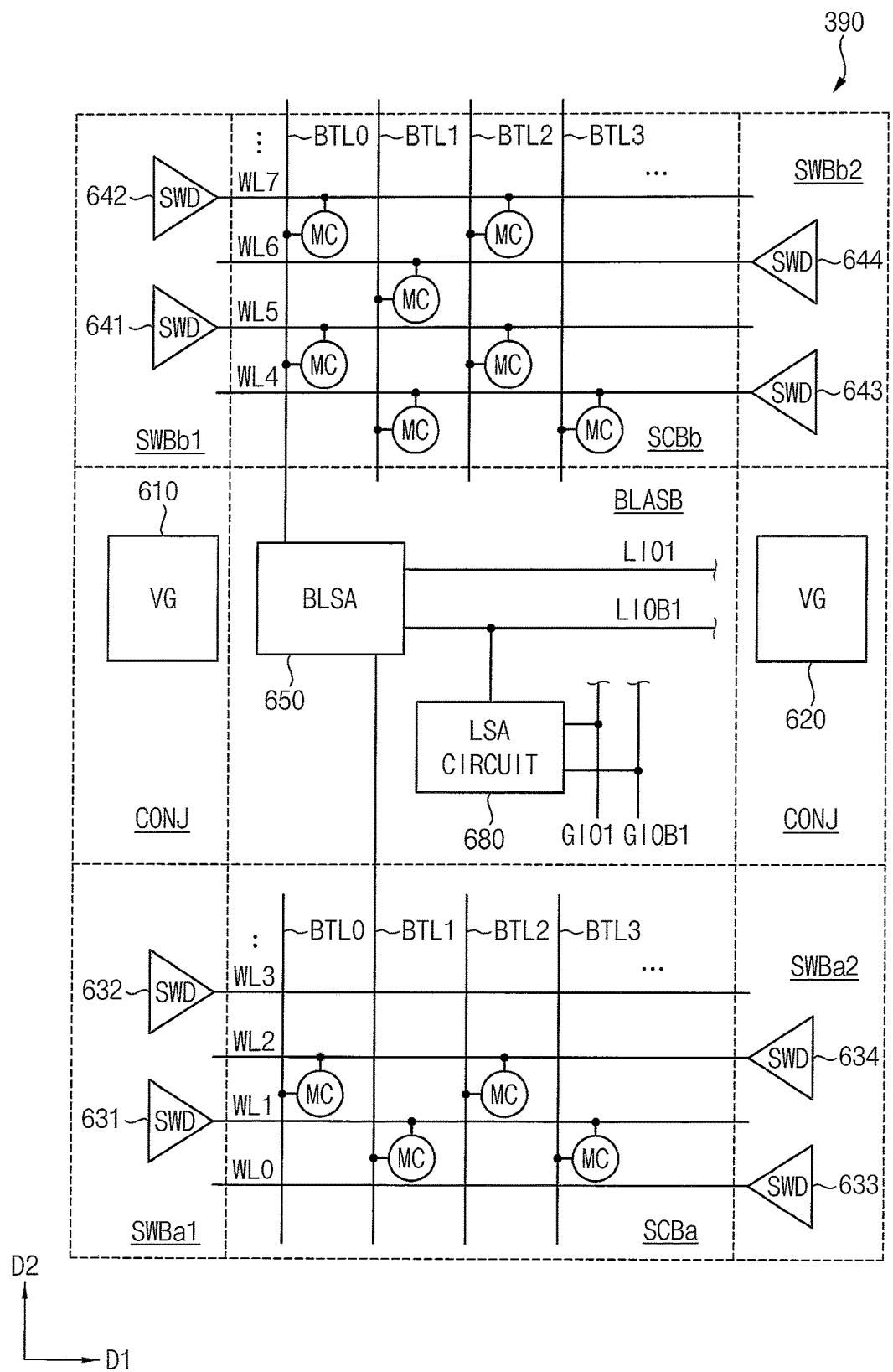
FIG. 10 illustrates a portion of the first bank array in FIG. 9 according to some example embodiments.

FIG. 10 illustrates a portion of the first bank array in FIG. 9 according to some example embodiments.

Referring to FIGS. 9 and 10, in the portion 390 of the first bank array 310a, sub-array blocks SCBa and SCBb, the bit-line sense amplifier regions BLSAB, four sub word-line driver regions SWBa1, SWBa2, SWBb1 and SWBb2 and two of the conjunction regions CONJ are disposed.

The sub-array block SCBa may include a plurality of word-lines WL0~WL3 extending in the first direction D1 and a plurality of bit-line BTL0~BTL3 extending in the second direction D2. The sub-array block SCBa may include a plurality of memory cells MCs disposed at intersections of the word-lines WL0~WL3 and the bit-line BTL0~BTL3. The sub-array block SCBb may include a plurality of word-lines WL4~WL7 extending in the first direction D1 and the plurality of bit-line BTL0~BTL3 extending in the second direction D2. The sub-array block SCBb may include a plurality of memory cells MCs disposed at intersections of the word-lines WL4~WL7 and the bit-line BTL0~BTL3.

With reference to FIG. 10, the sub word-line driver regions SWBa1 and SWBa2 may include a plurality of sub word-line drivers 631, 632, 633 and 634 that respectively drive the word-lines WL0~WL3. The sub word-line driver regions SWBb1 and SWBb2 may include a plurality of sub word-line drivers 641, 642, 643 and 644 that respectively drive the word-lines WL4~WL7.

The bit-line sense amplifier region BLSAB may include a bit-line sense amplifier BLSA 650 coupled to the bit-line BTL0 in the sub array block SCBb and the bit-line BTL1 in the sub array block SCBa, and a local sense amplifier LSA circuit 680. The bit-line sense amplifier 650 may sense and amplify a voltage difference between the bit-lines BTL0 and BTL1 to provide the amplified voltage difference to a local I/O line pair LIO1 and LIOB1.

The local sense amplifier circuit 680 may control electrical connection between the local I/O line pair LIO1 and LIOB1 and a global I/O line pair GIO1 and GIOB1.

As illustrated in FIG. 10, the conjunction regions CONJ may be disposed adjacent to the bit-line sense amplifier region BLSAB and the sub word-line driver regions SWBa1, SWBb1, SWBa2 and SWBb2. Voltage generators 610 and 620 may be disposed in the conjunction regions CONJ.

Figure 11:
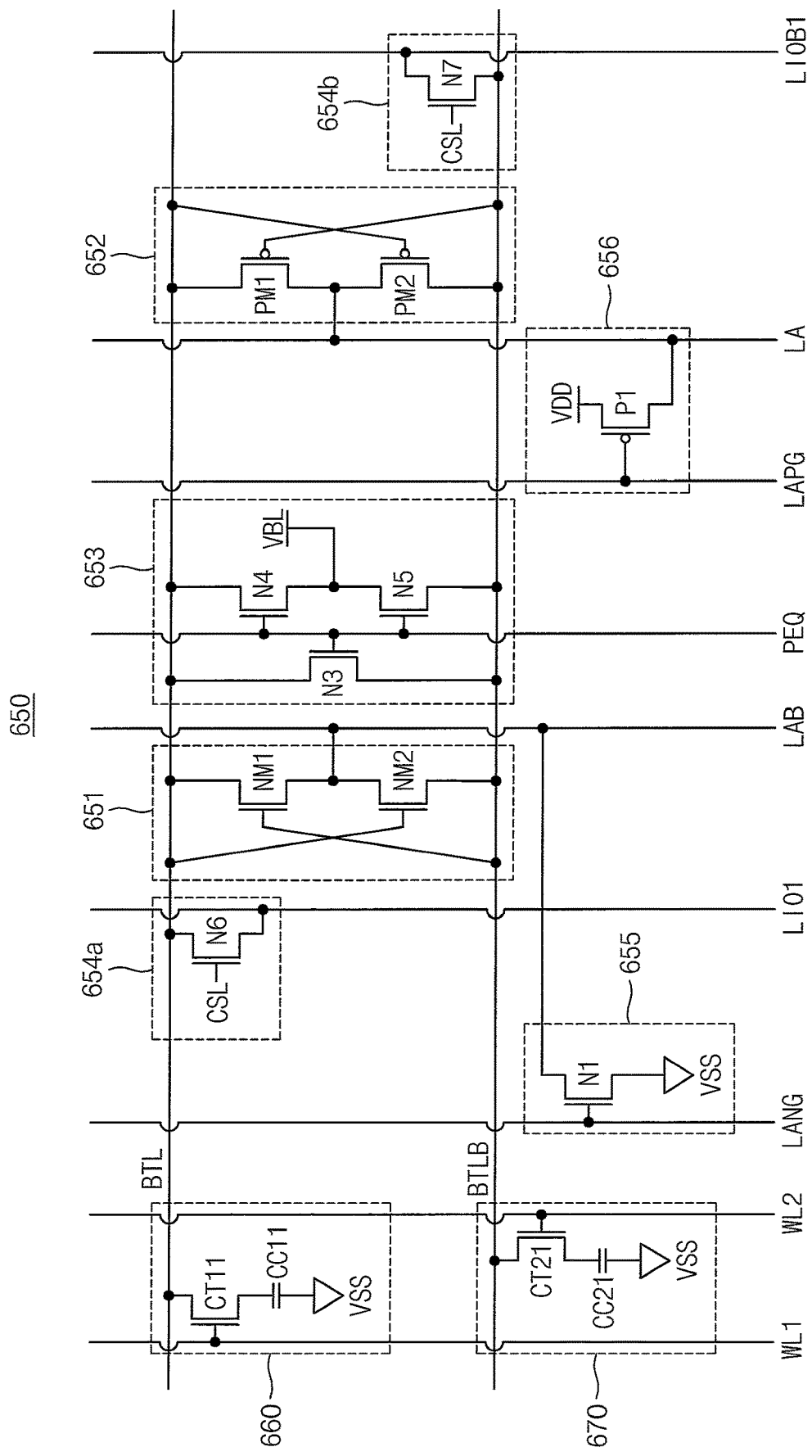
FIG. 11 is a circuit diagram illustrating the bit-line sense amplifiers in FIG. 10, according to example embodiments.

FIG. 11 is a circuit diagram illustrating the bit-line sense amplifiers in FIG. 10, according to example embodiments.

Referring to FIG. 11, the bit-line sense amplifier (BLSA) 650 is coupled to bit-lines BTL1 and BTLB1 of each of memory cells 660 and 670 in the memory cell array 310. Memory cell 660 may correspond to the memory cell MC of sub-array block SCB that is at the intersection of bit line BTL1 and word line WL1, and memory cell 670 may correspond to the memory cell MC of sub-array block SCB that is located at the intersection of bit line BTLB1 and word line WL2. The bit-line sense amplifier 650 shown in FIG. 11 includes an N-type sense amplifier 651, a P-type sense amplifier 652, a pre-charge circuit 653, column select switches 654a and 654b, an N-type sense amplifier (NSA) driver 655, and a P-type sense amplifier (PSA) driver 656.

The N-type sense amplifier 651 discharges a low-level bit-line of the bit-lines (or, bit-line pair) BL1 and BLB1 to a low level during a sensing operation. The N-type sense amplifier 651 includes two NMOS transistors NM1 and NM2. A gate of the NMOS transistor NM1 is connected to the bit-line (second bit-line) BTLB1, and a drain of the NMOS transistor NM1 is connected to the bit-line (first bit-line) BL1, and a source of the NMOS transistor NM1 is connected to a sense enable line LAB. The NMOS transistor NM2 has a gate connected to the bit-line BL1, a drain connected to the sense enable line LAB, and a source connected to the bit-line BLB1. The N-type sense amplifier 651 connects a low-level bit-line to the sense enable line LAB. The sense enable line LAB is connected to the ground voltage VSS.

The P-type sense amplifier 652 charges a high-voltage bit-line of the bit-lines BL1 and BLB1 with a power supply voltage VDD level at a sensing operation. The P-type sense amplifier 652 includes two PMOS transistors PM1 and PM2. The PMOS transistor PM1 has a gate connected to the bit-line BTLB1, a source connected to the bit-line BL1, and a drain connected to a sense enable line LA. The PMOS transistor PM2 has a gate connected to the bit-line BTL1, a source connected to sense enable line LA, and a drain connected to the bit-line BTLB1.

The P-type sense amplifier 652 charges a high-voltage bit-line of the bit-lines BTL1 and BTLB1 with a power supply voltage VDD provided to the sense enable line LA.

The PSA driver 656 provides a charging voltage VDD to the sense enable line LA. Therefore, the transistor PM2 is turned off because the gate of the transistor PM2 is coupled to the bit-line BTL1 with a voltage increased by the charge sharing.

The pre-charge circuit 653 pre-charges the bit-lines BTL1 and BTLB1 with a half voltage VDD/2 in response to a control signal PEQ in sensing operation. When the control signal PEQ is activated, the pre-charge circuit 653 supplies a bit-line pre-charge voltage VBL to the bit-lines BTL1 and BTLB1. The bit-line pre-charge voltage VBL may be a half voltage VDD/2. The bit-lines BTL1 and BTLB1 are connected such that their voltages are equalized. If the bit-lines BTL1 and BTLB1 are charged by the pre-charge level VBL, the control signal PEQ is inactivated. The pre-charge circuit 653 includes NMOS transistors N3, N4, and N5.

The column select switches 654a and 654b provide data sensed by the N-type and P-type sense amplifiers 651 and 652 to local I/O lines LIO1 and LIOB1 in response to a column selection signal CSL. The column select switches 654a and 654b are turned on such that the sensed data is transferred to the local I/O lines LIO1 and LIOB1. For example, in a read operation when sensing levels of the N-type and P-type sense amplifiers 651 and 652 are stabilized, a column selection signal CSL is activated. Then the column select switches 654a and 654b are turned on such that the sensed data is transferred to the local I/O line pair LIO1 and LIOB1. Voltages of the bit-lines BTL1 and BTLB1 are varied when charges of bit-lines BL1 and BLB1 are shared with the local I/O lines LIO1 and LIOB1. The column select switches 654a and 654b includes NMOS transistors N6 and N7, respectively.

The NSA driver 655 provides a driving signal to the sense enable line LAB of the N-type sense amplifier 651. Based on the control signal LANG, the NSA driver 655 grounds the sense enable line LAB. The NSA driver 655 includes the ground transistor N1 to control a voltage of the sense enable line LAB. The PSA driver 656 provides the charge voltage VDD to the sense enable line LA of the P-type sense amplifier 652. The PSA driver 656 includes the PMOS transistor P1 to control a voltage of the sense enable line LA. The control signals LAPG and LANG are complementary to each other.

The control signals in FIG. 11 may be included in the third control signal CTL3 in FIG. 2.

Figure 12:
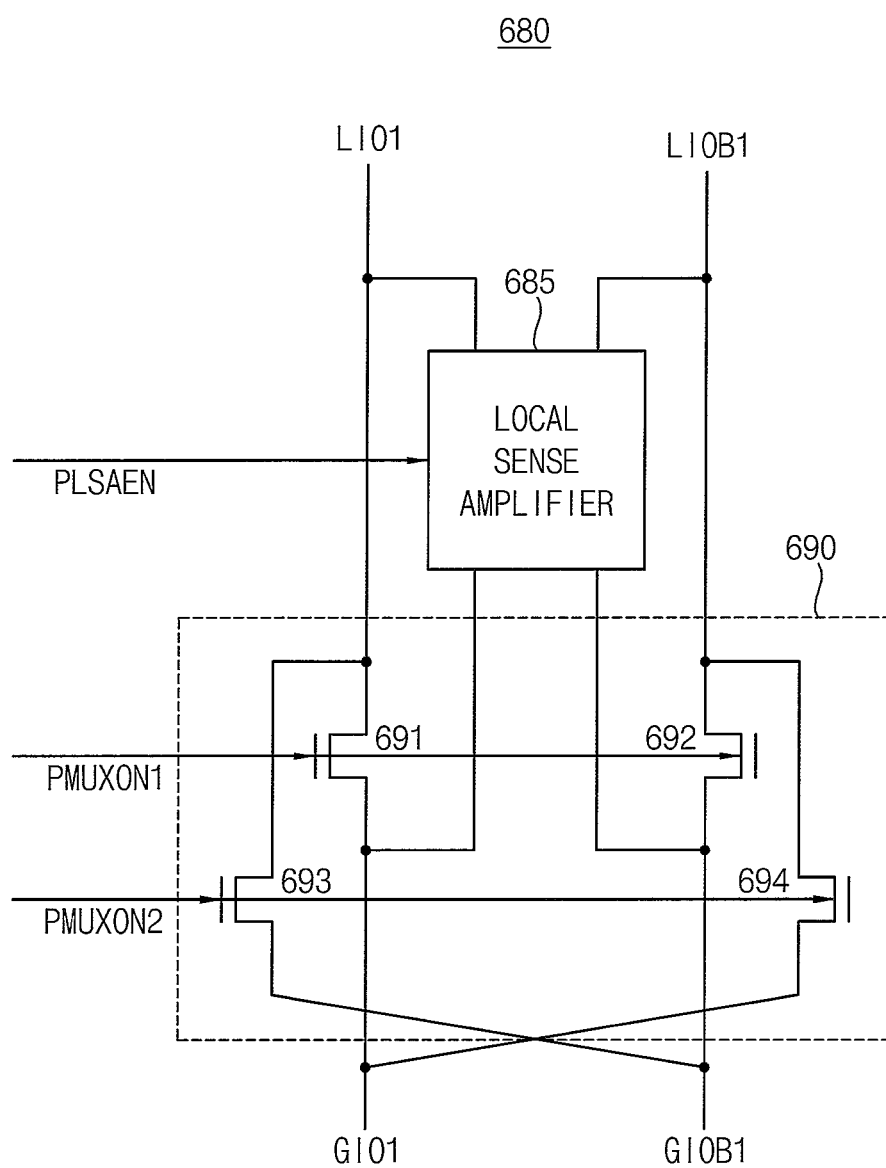
FIG. 12 illustrates the local sense amplifier circuit in FIG. 10 according to example embodiments.

FIG. 12 illustrates the local sense amplifier circuit in FIG. 10 according to example embodiments.

Referring to FIG. 12, the local sense amplifier circuit 680 includes a local sense amplifier 685 and a local I/O line controller 690.

The local sense amplifier 685 amplifies a voltage difference between the local I/O line pair LIO1 and LIOB1 in response to a local sense enable signal PLSAEN to provide the amplified voltage difference to a global I/O line pair GIO1 and GIOB1. The local I/O line controller 690 includes first through fourth NMOS transistors 691, 692, 693 and 694, and controls connection between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN, the first connection control signal PMUXON1, and the second connection control signal PMUXON2 is a low level the local sense amplifier 685 is disabled and the local I/O line controller 690 cuts off the connection between the local I/O line pair LIO1 and LIOB1 and the global I/O line pair GIO1 and GIOB1.

For example, when each of the first local sense enable signal PLSAEN, the first connection control signal PMUXON1, and the second connection control signal PMUXON2 is a high level the local sense amplifier 685 is enabled and the local I/O line controller 690 provides the connection between the local I/O line pair LIO1 and LIOB1 and the global I/O line pair GIO1 and GIOB1. Bit-line sense amplifiers (BLSA) 650 of FIG. 11 and local sense amplifiers 685 of FIG. 12 may form the sense amplifiers of the sense amplifier unit 285 of FIG. 3

Figure 13:
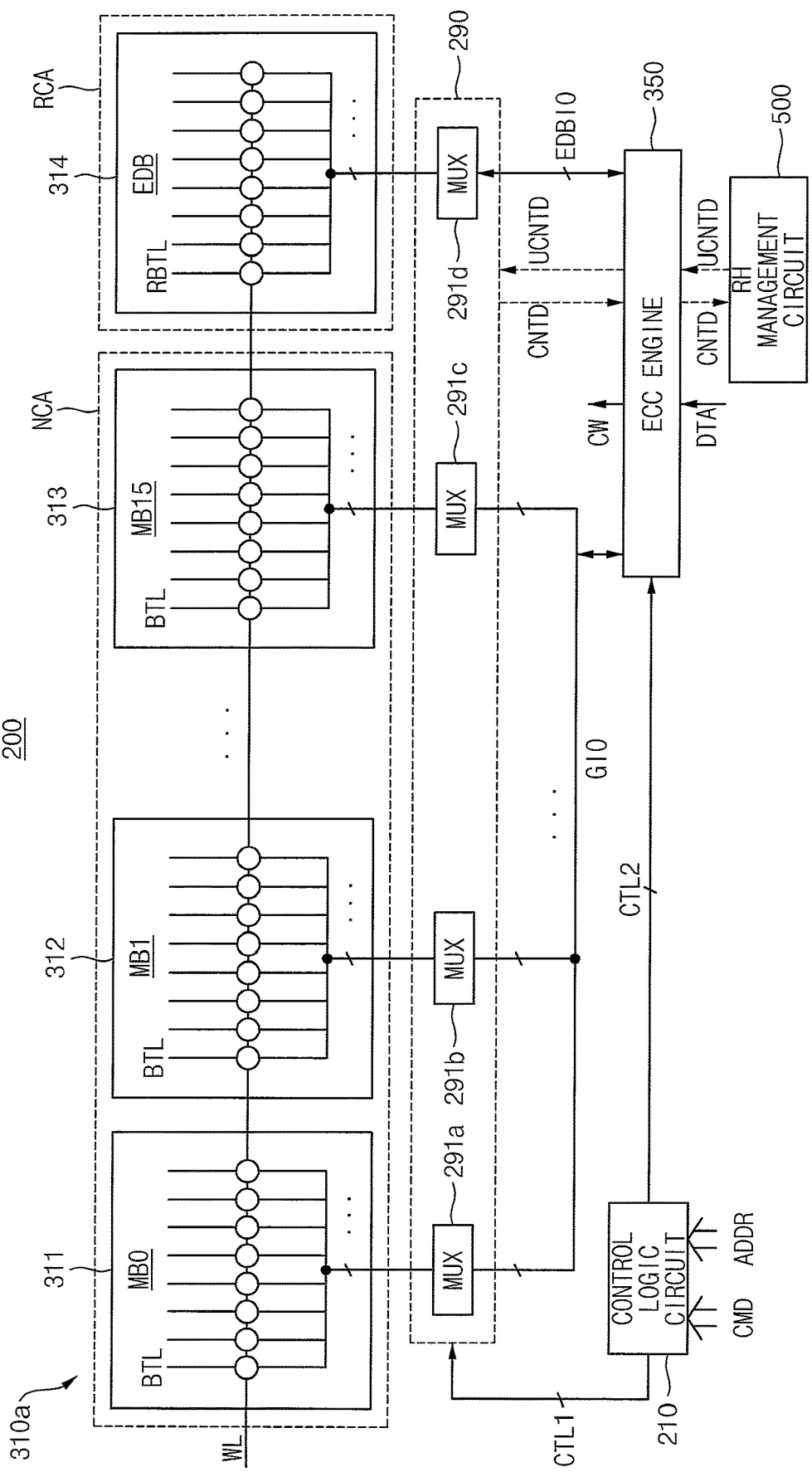
FIG. 13 illustrates a portion of the semiconductor memory device of FIG. 3 for explaining a write operation.

FIG. 13 illustrates a portion of the semiconductor memory device of FIG. 3 for explaining a write operation.

In FIG. 13, the control logic circuit 210, the first bank array 310*a*, the I/O gating circuit 290, the ECC engine 350 and the row hammer management circuit 500 are illustrated.

Referring to FIG. 13, the first bank array 310*a* includes a normal cell region NCA and a redundancy cell region RCA.

The normal cell region NCA includes a plurality of first memory blocks MB0~MB15, i.e., 311~313, and the redundancy cell array RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells in the first memory blocks 311~313, the second memory block 314 is also referred to as an EDB block. The first memory blocks 311~313 and the second memory block 314 may each be representative of a sub array block SCB in FIG. 9.

The I/O gating circuit 290 includes a plurality of switching circuits 291*a*~291*d* respectively connected to the first memory blocks 311~313 and the second memory block 314.

The ECC engine 350 may be connected to the switching circuits 291*a*~291*d* through first data lines GIO and second data lines EDBIO. The control logic circuit 210 may receive the command CMD and the address ADDR and may decode the command CMD to generate the first control signal CTL1 for controlling the switching circuits 291*a*~291*d* and the second control signal CTL2 for controlling the ECC engine 350.

When the command CMD is a write command, the control logic circuit 210 provides the second control signal CTL2 to the ECC engine 350. The ECC engine 350 performs the ECC encoding on the data DTA to generate parity data associated with the data DTA and provides the I/O gating circuit 290 with the codeword CW formed by the data DTA and the parity data. The control logic circuit 210 provides the first control signal CTL1 to the I/O gating circuit 290 such that the codeword CW is to be stored in a sub-page of the target page in the first bank array 310*a*.

When the command CMD that is received after the write command corresponds to the active count update command, the control logic circuit 210 provides the first control signal CTL1 to the I/O gating circuit 290 such that the I/O gating circuit 290 reads the count data CNTD and count parity data associated with the count data CNTD from the target page of the first bank array 310*a* and provides the count data CNTD and the count parity data to the ECC engine 350. The ECC engine 350 performs an ECC decoding operation on the count data CNTD, and using the count parity data, identifies and corrects one or more error bits (if they exist) in the count data CNTD and provides the count data CNTD as a corrected count data C_CNTD to the row hammer management circuit 500, at a timing determined by the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 290.

The ECC engine 350 may perform an ECC decoding operation on the count data CNTD and may perform an ECC encoding operation on the updated count data UCNTD by masking the data DTA.

For example, the ECC engine 350 and row hammer management circuit 500 may perform the internal read-update-write operation to read the count data CNTD, to update the read count data and to write the updated count data, in response to the active count update command. When the ECC engine 350 and row hammer management circuit 500 perform the internal read-update-write operation, the control logic circuit 210 may perform the internal write operation to write the count data during a second write time interval. That is, the control logic circuit 210 may perform the normal write operation to write data in a first group of cells (that are not the count cells) of the target memory cell row during a first write time interval and may perform the internal write operation to write the count data in the count cells of the target memory cell row during the second write time interval that is smaller than the first write time interval.

Figure 14:
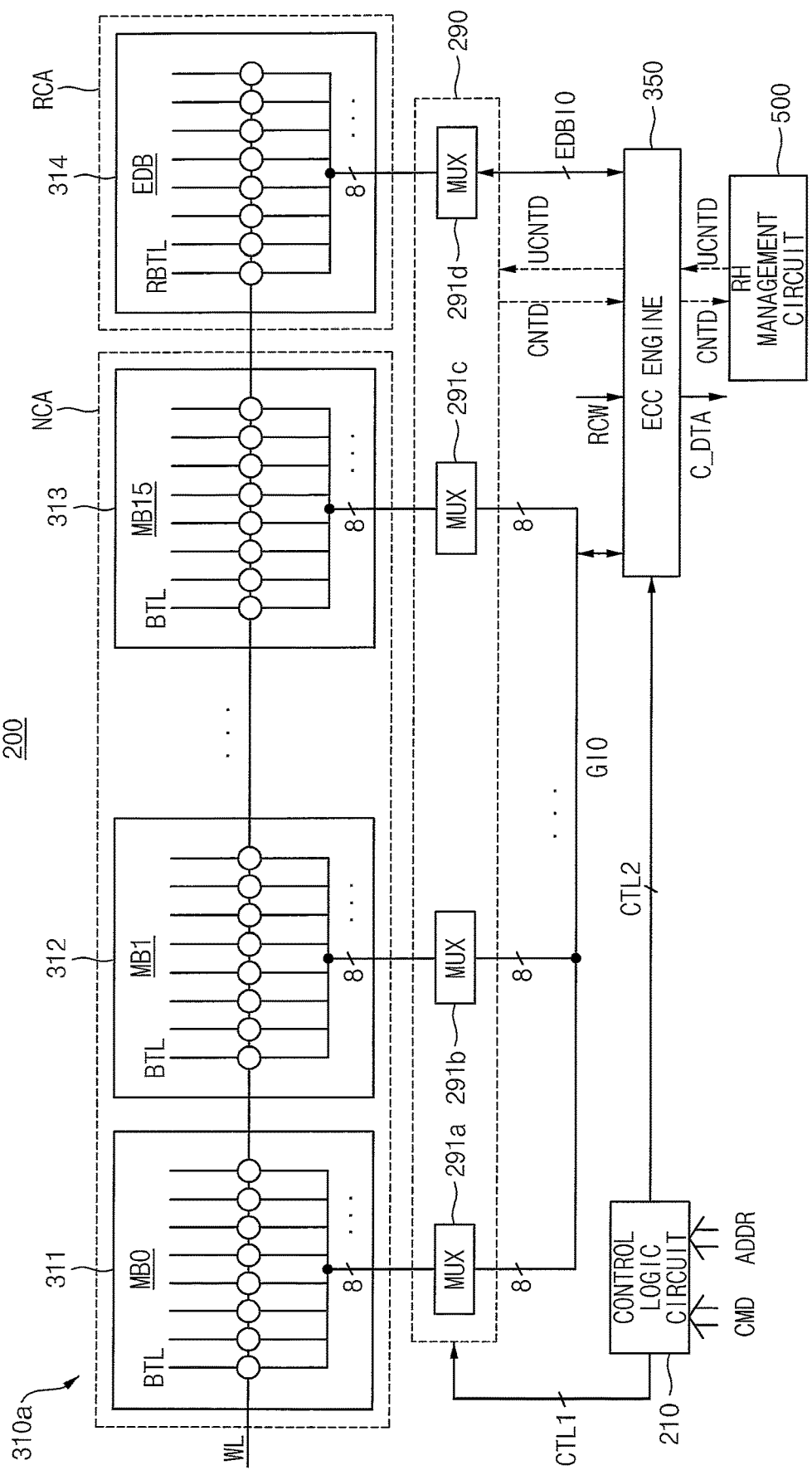
FIG. 14 illustrates a portion of the semiconductor memory device of FIG. 5 for explaining a read operation.

FIG. 14 illustrates a portion of the semiconductor memory device of FIG. 3 for explaining a read operation. Description repeated with FIG. 13 will be omitted.

Referring to FIG. 14, when the command CMD is a read command to designate a read operation, the control logic circuit 210 provides the first control signal CTL1 to the I/O gating circuit 290 such that a (read) codeword RCW stored in the sub-page of the target page in the first bank array 310*a* is provided to the ECC engine 350.

When the command CMD that is received after the read command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310*a* and provides the count data CNTD and the count parity data to the ECC engine 350. The ECC engine 350 performs an ECC decoding operation on the count data CNTD and, using the count parity data, detects and corrects one or more error bits (if they exist) in the count data CNTD and provides the count data CNTD as a corrected count data C_CNTD to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the count cells of the target page through the I/O gating circuit 290.

The ECC engine 350 may perform an ECC decoding operation on the count data CNTD and may perform an ECC encoding operation on the updated count data UCNTD by masking the data DTA.

For example, the ECC engine 350 and row hammer management circuit 500 may perform the internal read-update-write operation to read the count data CNTD, to update the read count data and to write the updated count data, in response to the active count update command. When the ECC engine 350 and row hammer management circuit 500 perform the internal read-update-write operation, the control logic circuit 210 may perform the internal write operation to write the count data during a second write time interval.

Figure 15:
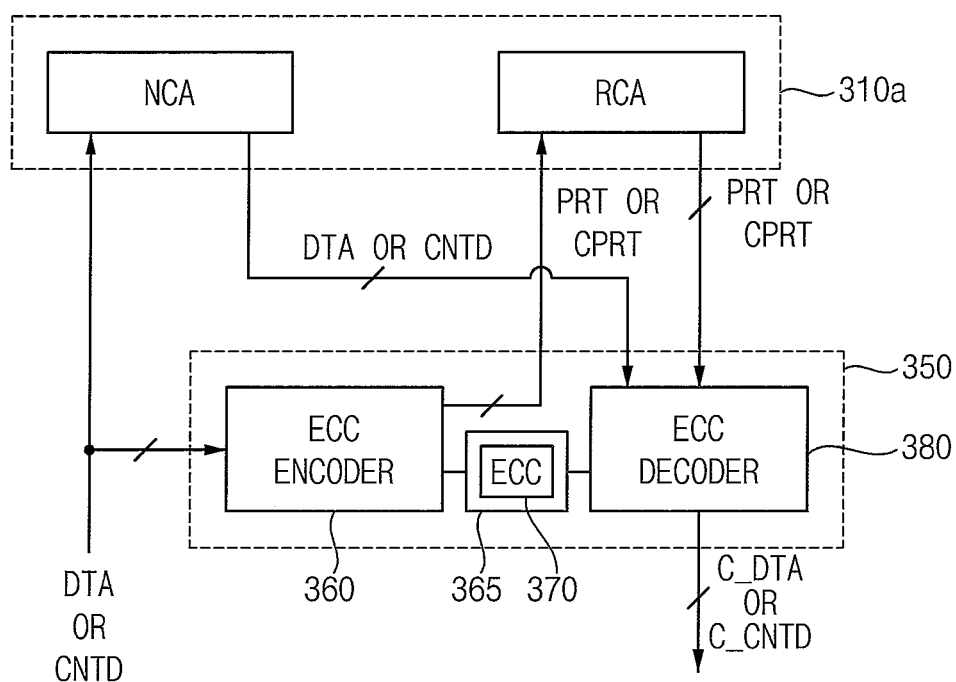
FIG. 15 is a block diagram illustrating an example of the ECC engine in the semiconductor memory device of FIG. 3 according to example embodiments.

FIG. 15 is a block diagram illustrating an example of the ECC engine in the semiconductor memory device of FIG. 3 according to example embodiments.

Referring to FIG. 15, the ECC engine 350 may include an ECC encoder 360, an ECC decoder 380 and an (ECC) memory 365. The memory 365 may store an ECC 370. The ECC 370 may be a single error correction (SEC) code or a single error correction/double error detection (SECDED) code.

The ECC encoder 360 may receive the data DTA from the data I/O buffer 320 and generate parity data PRT using the received data DTA. The data DTA may be stored in the normal cell array NCA of the first bank array 310*a*. The parity data PRT may be stored in the redundancy cell region RCA of the first bank array 310*a*. In addition, the ECC encoder 360 may receive the count data CNTD as an updated count data UCNTD from the row hammer management circuit 500 and generate count parity data CPRT using the ECC 370, associated with the count data CNTD (i.e., updated count data UCNTD) to be stored in the count cells of the normal cell region NCA of the first bank array 310*a*. The count parity data CPRT may be stored in the redundancy cell region RCA of the first bank array 310*a*.

The control logic circuit 210 may control the ECC engine 350 such that a first ratio of bits of the parity data PRT over bits of the data DTA is smaller than a second ratio of bits of the count parity data CPRT over bits of the count data CNTD. Therefore, the ECC engine 350 may assign a higher ratio of parity bits to the count data CNTD than the ratio of parity bits to data DTA, may perform a first ECC decoding on the data DTA based on the parity data PRT to correct a maximum of a first number of error bits in a read operation on the data DTA and may perform a second ECC decoding on the count data CNTD based on the count parity data CPRT to correct a maximum of a second number of error bits in the count data CNTD in a read operation on the count data CNTD. The second number may be greater than the first number.

The ECC decoder 380 may perform a first ECC decoding operation on the read data RMD and the parity data PRT read from the first bank array 310*a* (stored as ECC 370), identify and correct bit errors in the read data RMD as appropriate. When the read data RMD includes error bit(s) (detected as a result of the ECC decoding), the ECC decoder 380 may correct the error bit in the read data RMD and may provide a corrected data C_DTA to the data I/O buffer 320.

In addition, the ECC decoder 380 may perform a second ECC decoding operation on the count data CNTD based on the count data CNTD and the count parity data CPRT read from the first bank array 310*a* using the ECC 370. When the count data CNTD includes error bit(s) as (detected as a result of the ECC decoding), the ECC decoder 380 may correct the error bit in the count data CNTD and may provide a corrected count data C_CNTD to the row hammer management circuit 500. As will be appreciated, the maximum number of bits that may be identified and corrected using ECC is a function of the size of the data and number of parity bits of the ECC code.

FIGS. 16 through 18 illustrate example commands which may be used in the memory system of FIG. 1.

FIG. 16 illustrates combinations of a chip selection signal CS_n and first through fourteenth command-address signals CA0~CA13 representing an active command ACT, a write command WR and a read command RD, FIG. 17 illustrates combinations of the chip selection signal CS_n and the first through fourteenth command-address signals CA0~CA13 representing a write command WRA including an auto precharge and a read command RDA including an auto precharge, and FIG. 18 illustrates combinations of the chip selection signal CS_n and the first through fourteenth command-address signals CA0~CA13 representing precharge commands PREab, PREsb and PREpb.

In FIGS. 16 through 18, H indicates a logic high level, L indicates a logic low level, V indicates a valid logic level corresponding to one of the logic high level H and the logic low level L, R0~R17 indicate bits of a row address, BA0 through BA2 indicate bits of a bank address, BG0 through BG2 indicate bits of a bank group address, and CID0 through CID3 indicate die identifier of a memory die (or a memory chip) when the semiconductor memory device 200 is implemented with a stacked memory device including a plurality of memory dies. In addition, in FIGS. 16 and 17, C2~C10 indicate bits of a column address, in FIGS. 16 and 17, BL indicates burst length flag and in FIG. 17, AP indicates auto precharge flag.

Referring to FIG. 16, the active command ACT, the write command WR and the read command RD may be transferred during two cycles, for example, during the logic high level H and the logic low level L of the chip selection signal CS_n. The active command ACT may include the bank address bits BA0 and BA1 and the row address bits R0~R17.

Referring to FIG. 17, the write command WRA including an auto precharge and the read command RDA including an auto precharge may be transferred during two cycles, for example, during the logic high level H and the logic low level L of the chip selection signal CS_n, and may include the bank address bits BA0 and BA1 and the column address bits C3~C10 or C2~C10. Either the tenth command-address signal CA9 or the eleventh command-address signal CA10 of the write command WRA including an auto precharge and the read command RDA including an auto precharge may be used (e.g., identified by the semiconductor memory device) as an active count update flag and thus may be used to initiate an internal read-update-write operation of the count data of the memory row(s) identified by these commands.

In FIG. 18, PREpb is a precharge command to precharge a particular bank in a particular bank group, PREab is an all bank precharge command to precharge all banks in all bank groups and PREsb is a same bank precharge command to precharge the same bank in all bank groups.

Referring to FIG. 18, the ninth command-address signal CA8 or the tenth command-address signal CA9 of each of the precharge commands PREab and PREsb may be used as an active count update flag.

Figure 19:
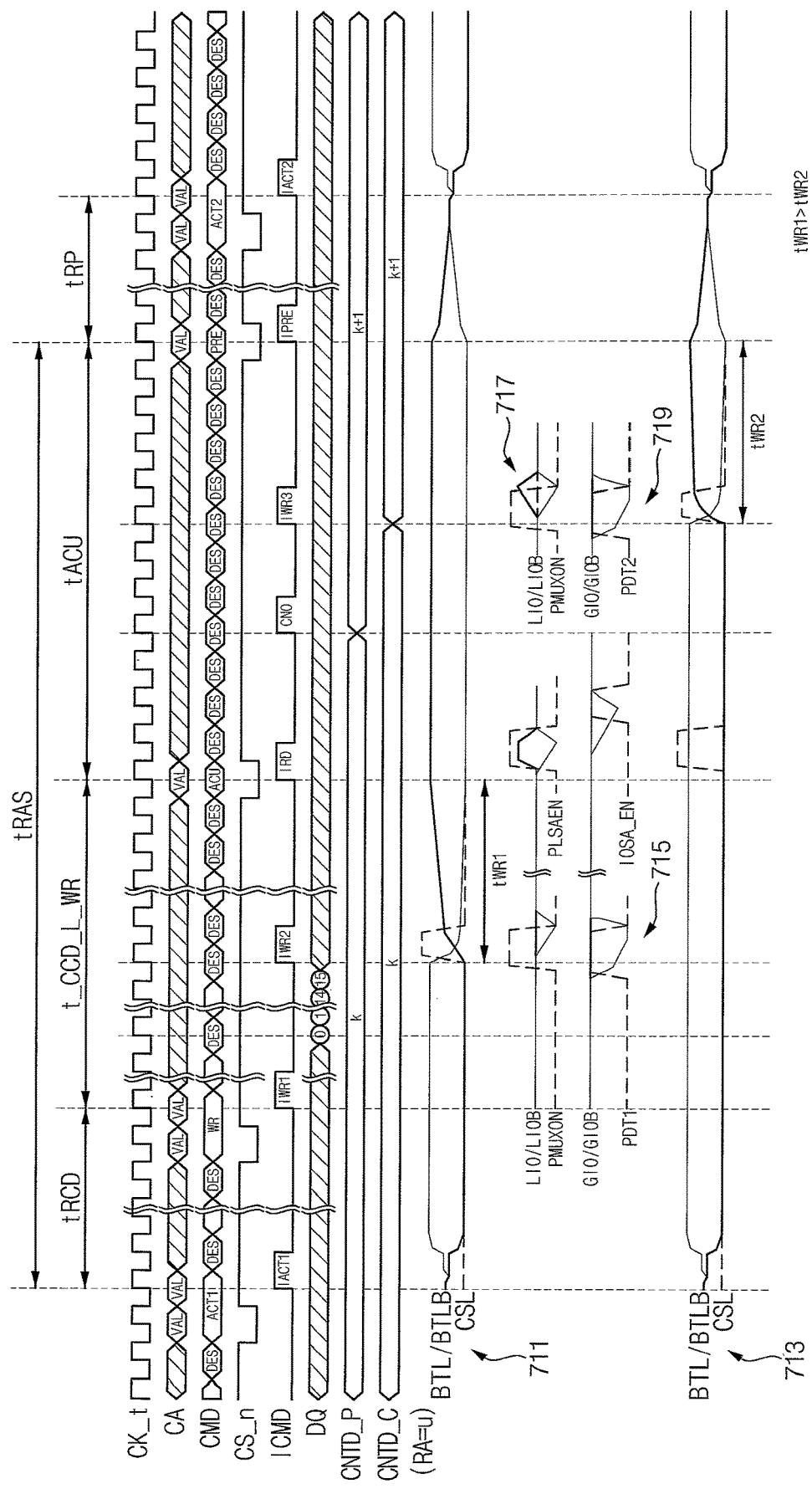
FIGS. 19 and 20 illustrate examples of command protocols of the memory system and operation of the semiconductor memory device when the memory system uses the active count update command, respectively.
Figure 20:
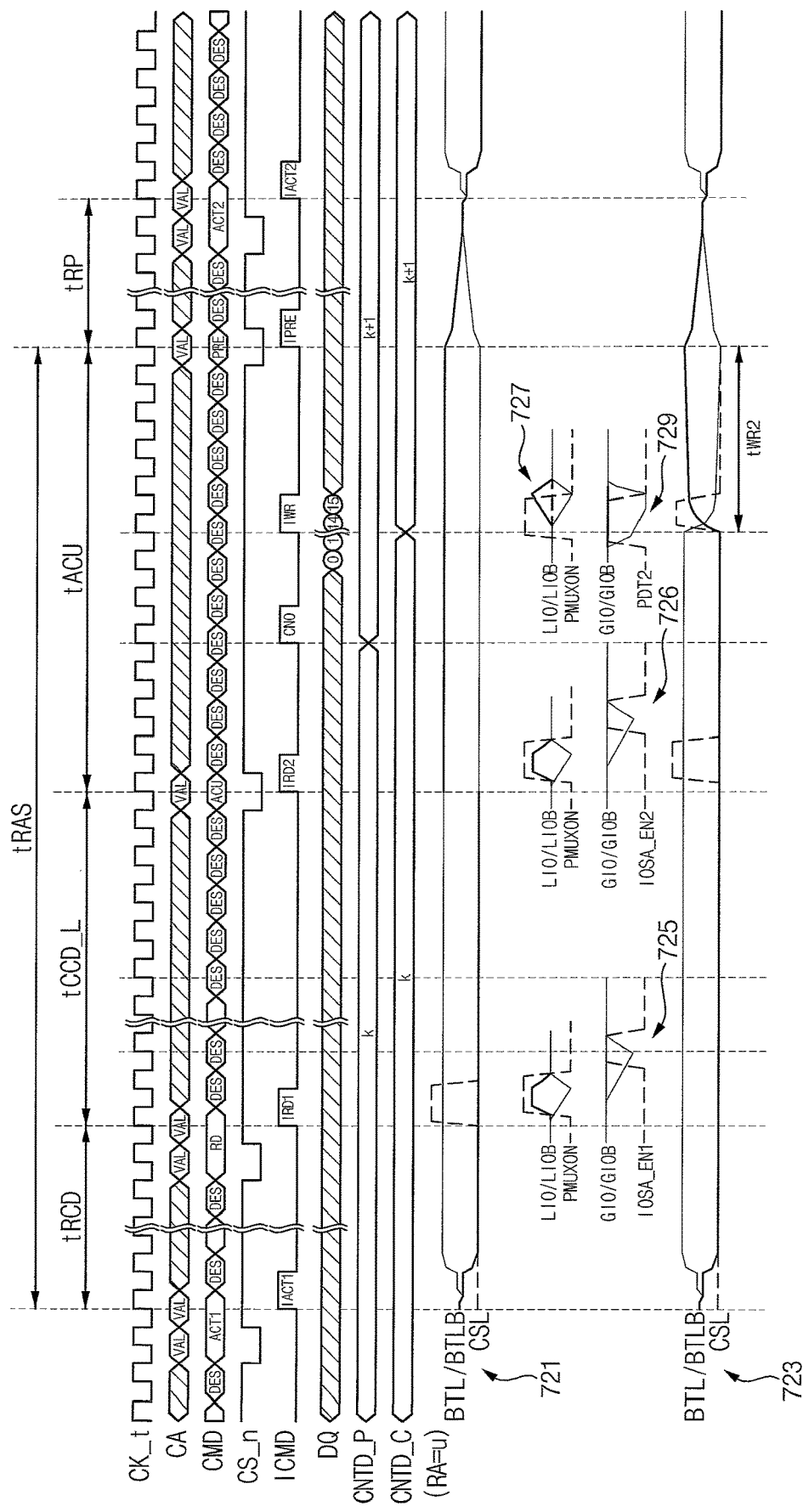

FIGS. 19 and 20 illustrate examples of command protocols of the memory system and operation of the semiconductor memory device when the memory system uses the active count update command, respectively.

In FIGS. 19 and 20, a clock pair CK_t is illustrated.

Referring to FIGS. 1, 2, 3 and 19, the scheduler 55 in the memory controller 30 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a write command WR designating a write operation on the first target memory cell row to the semiconductor memory device 200 in synchronization with an edge of the clock signal CK_t. The control logic circuit 210 enables a first write signal IWR1 in response to the write command WR, performs a write operation to write bits of the data signal DQ in normal memory cells of the first target memory cell row by enabling a first read signal IRD1 when the data signal DQ is input.

After a time interval corresponding to a delay time of consecutive write commands to the same bank group tCCD_L_WR from applying the write command WR, the scheduler 55 applies an active count update command ACU to the semiconductor memory device 200 in synchronization with an edge of the clock signal CK_t and the control logic circuit 210 performs an internal read-update-write operation to read the count data CNTD from the count cells of the first target memory cell row, to update the read count data CNTD CNO and stores the updated count data in the first target memory cell row by sequentially enabling a read signal IRD and a second write signal IWR2 during an active count update time interval tACU in response to the active count update command ACU. Therefore, bit values of the count data CNTD_C stored in the count cells of the first target memory cell row designated by the first target row address (e.g., RA=u) is increased by one from k to k+1. In addition, bit values of count data CNTD_P in peripheral region connected to the count cells is increased by one from k to k+1 at a timing when the read count data CNTD is updated.

After a time interval corresponding to a row active time interval tRCD from applying the active count update command ACU, the scheduler 55 applies a precharge command PRE to the semiconductor memory device 200 and after a time interval corresponding to precharge time tRP, the scheduler 55 applies a second active command ACT2 to the semiconductor memory device 200.

The control logic circuit 210 enables a precharge signal IPRE in response to the second active command ACT2 to precharge a first target word-line and enables a second active signal IACT2 in response to the second active command ACT2 to enable a second target word-line coupled to a second target memory cell row.

In FIG. 19, reference numeral 711 denotes voltage levels of the bit-lines BTL/BTLB and the column selection line CSL which are connected to first bit-line sense amplifiers coupled to the normal cells, and reference numeral 713 denotes voltage levels of the bit-lines BTL/BTLB and the column selection line CSL which are connected to second bit-line sense amplifiers coupled to the count cells. In addition, reference numeral 715 denotes a driving signal PDT1 applied to global I/O lines GIO/GIOB coupled to the normal cells, and reference numeral 719 denotes a driving signal PDT2 applied to global I/O lines GIO/GIOB coupled to the count cells. In addition, reference numeral 717 denotes voltage levels of the connection control signal PMUXON and the local I/O lines LIO/LIOB which are connected to the local amplifier circuit coupled to the count cells.

Referring to FIG. 19, when the control logic circuit 210 applies the driving signal PDT1 to the global I/O lines GIO/GIOB and enables the connection control signal PMUXON in response to the second write signal IWR2, a voltage difference occurs in the local I/O lines LIO/LIOB, and when the control logic circuit 210 increases a voltage level of the column selection line CSL, voltage levels of the bit-lines BTL/BTLB are inverted, and data is stored in the normal cells during a first write time interval tWR1.

When the control logic circuit 210 increases a voltage level of the column selection line CSL coupled to the count cells in response to the read signal IRD, a voltage level of the bit-lines BTL/BTLB is sensed and the sensed voltage level is provided to the local sense amplifier circuit 680. When the control logic circuit 210 activates the local sense enable signal PLSAEN and the enable signal IOSA_EN, the count data is provided the row hammer management circuit 500.

The row hammer management circuit 500 updates CNO the count data. When the control logic circuit 210 applies the driving signal PDT2 to the global I/O lines GIO/GIOB and enables the connection control signal PMUXON in response to the third write signal IWR3, a voltage difference occurs in the local I/O lines LIO/LIOB, and when the control logic circuit 210 increases a voltage level of the column selection line CSL, voltage levels of the bit-lines BTL/BTLB are inverted, and the count data is stored in the count cells during a second write time interval tWR2.

The control logic circuit 210 may reduce the active count update time interval tACU by performing a voltage boosting operation to increase at least one of a level and an activation interval of voltages associated with the internal write operation to write count data in the count cells more than at least one of a level and an activation interval of voltages associated with the normal write operation to write the data in the normal cells such that the second write time interval tWR2 is smaller than the first write time interval tWR1. That is, the control logic circuit 210 may enlarge at least one of a level and an activation interval of voltages associated with the third write signal IWR3 more than at least one of a level and an activation interval of voltages associated with the second write signal IWR2.

With regard to reference numeral 717, the control logic circuit may reduce the second write time interval tWR2 by disabling the P sense amplifier 652 in the bit-line sense amplifier 650 if FIG. 11 in a normal write operation to write the data in the normal cells and by disabling the P sense amplifier 652 in the bit-line sense amplifier 650 if FIG. 11 in an internal write operation to write the count data in the count cells.

Referring to FIGS. 1, 2, 3 and 20, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a write command WR designating a read operation on the first target memory cell row to the semiconductor memory device 200 in synchronization with an edge of the clock signal CK_t after a time interval correspond to a delay time tRCD. The control logic circuit 210, in response to the read command RD, performs a read operation to read data stored in the first target memory cell row by enabling a first read signal IRD1.

After a time interval corresponding to a delay time of consecutive read commands to the same bank group tCCD_L from applying the read command RD, the scheduler 55 applies an active count update command ACU to the semiconductor memory device 200 in synchronization with an edge of the clock signal CK_t and the control logic circuit 210 reads the count data CNTD from the count cells of the first target memory cell row, updates the read count data CNTD and stores the updated count data in the first target memory cell row by sequentially enabling a second read signal IRD2 and a write signal IWR in response to the active count update command ACU.

Therefore, bit values stored in the first target memory cell row designated by the first target row address (e.g., RA=u) is increased by one from k to k+1.

In addition, bit values of count data CNTD_P in peripheral region connected to the count cells is increased by one from k to k+1 at a timing when the read count data CNTD is updated.

After a time interval corresponding to a time tACU of performing the internal read-update-write operation from applying the active count update command ACU, the scheduler 55 applies a precharge command PRE to the semiconductor memory device 200 and the control logic circuit 210, in response to the precharge command PRE, precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

In FIG. 20, reference numeral 721 denotes voltage levels of the bit-lines BTL/BTLB and the column selection line CSL which are connected to first bit-line sense amplifiers coupled to the normal cells, and reference numeral 723 denotes voltage levels of the bit-lines BTL/BTLB and the column selection line CSL which are connected to second bit-line sense amplifiers coupled to the count cells. In addition, reference numeral 725 denotes an enable signal IOSA_EN1 applied to I/O sense amplifier coupled to global I/O lines GIO/GIOB coupled to the normal cells, reference numeral 726 denotes an enable signal IOSA_EN2 applied to I/O sense amplifier coupled to global I/O lines GIO/GIOB coupled to the count cells and reference numeral 729 denotes a driving signal PDT2 applied to global I/O lines GIO/GIOB coupled to the count cells. In addition, reference numeral 727 denotes voltage levels of the connection control signal PMUXON applied to the local amplifier circuit coupled to the count cells and the local I/O lines LIO/LIOB which are connected to the local amplifier circuit.

Referring to FIG. 20, when the control logic circuit 210 increases a voltage level of the column selection line CSL coupled to the normal cells in response to the first read signal IRD1, a voltage level of the bit-lines BTL/BTLB is sensed and the sensed voltage level is provided to the local sense amplifier circuit 680. When the control logic circuit 210 activates the local sense enable signal PLSAEN and the enable signal IOSA_EN, the data is output.

When the control logic circuit 210 increases a voltage level of the column selection line CSL coupled to the count cells in response to the second read signal IRD2, a voltage level of the bit-lines BTL/BTLB is sensed and the sensed voltage level is provided to the local sense amplifier circuit 680. When the control logic circuit 210 activates the local sense enable signal PLSAEN and the enable signal IOSA_EN, the count data is provided the row hammer management circuit 500.

The row hammer management circuit 500 updates CNO the count data. When the control logic circuit 210 applies the driving signal PDT2 to the global I/O lines GIO/GIOB and enables the connection control signal PMUXON in response to the write signal IWR, a voltage difference occurs in the local I/O lines LIO/LIOB, and when the control logic circuit 210 increases a voltage level of the column selection line CSL, voltage levels of the bit-lines BTL/BTLB are inverted, and the count data is stored in the count cells during a second write time interval tWR2.

With regard to reference numeral 727, the control logic circuit may reduce the second write time interval tWR2 by disabling the P sense amplifier 652 in the bit-line sense amplifier 650 if FIG. 11 in a normal write operation to write the data in the normal cells and by disabling the P sense amplifier 652 in the bit-line sense amplifier 650 if FIG. 11 in an internal write operation to write the count data in the count cells.

In FIGS. 19 and 20, circuit elements associated with inputting/outputting normal data (user data) to/from the normal cells may be referred to as first bit-line sense amplifiers, a first local sense amplifier circuit, a driver and an I/O sense amplifier. Voltages provided to the first bit-line sense amplifiers, the first local sense amplifier circuit, the driver and the I/O sense amplifier may be referred to as a first group of voltages. In addition, circuit elements associated with inputting/outputting the count data (user data) to/from the count cells may be referred to as second bit-line sense amplifiers, a second local sense amplifier circuit, a driver and an I/O sense amplifier. Voltages provided to the second bit-line sense amplifiers, the second local sense amplifier circuit, the driver and the I/O sense amplifier may be referred to as a second group of voltages. The driver and the I/O sense amplifier may be commonly used.

Figure 21:
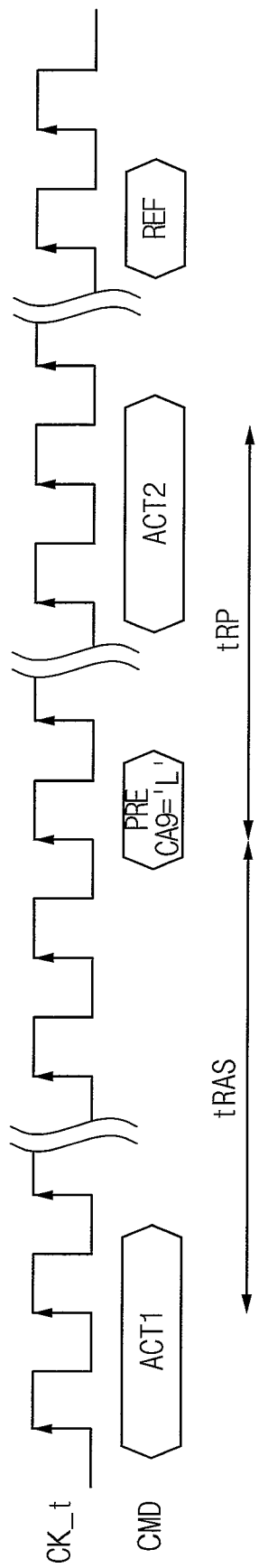
FIG. 21 illustrates an example of the command protocol of the memory system when the memory system updates the count data based on the precharge command.

FIG. 21 illustrates an example of the command protocol of the memory system when the memory system updates the count data based on the precharge command.

Referring to FIGS. 1, 2, 18 and 21, the scheduler 55 applies the first active command ACT1 to the semiconductor memory device 200 in synchronization with an edge of the clock signal CK_t, and applies the precharge command PRE including a flag designating an internal read-update-write operation on the count data stored in a target memory cell designated by a target row address accompanied by the first active command ACT1 to the semiconductor memory device 200 after a tRAS corresponding to active to precharge time elapses. In this case, the scheduler 55 may set the tenth command-address signal CA9 of the precharge command PRE to a logic low level L. Although not shown in FIG. 19, the scheduler 55 may apply a read command or a write command to the semiconductor memory device 200 in synchronization with an edge of the clock signal CK_t.

After a time interval corresponding to precharge time tRP, the scheduler 55 applies a second active command ACT2 to the semiconductor memory device 200 in synchronization with an edge of the clock signal CK_t and applies a refresh command REF to the semiconductor memory device 200. The semiconductor memory device 200 performs a hammer refresh operation on one or more victim memory cell rows physically adjacent to a memory cell row corresponding to the hammer address, in response to the refresh command REF.

Figure 22:
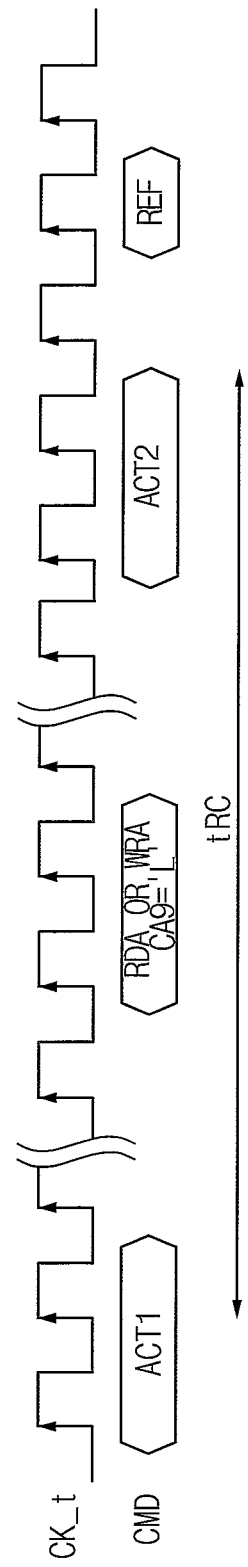
FIG. 22 illustrates an example of the command protocol of the memory system when the memory system updates the count data based on the read command including an auto precharge or the write command including an auto precharge.

FIG. 22 illustrates an example of the command protocol of the memory system when the memory system updates the count data based on the read command including an auto precharge or the write command including an auto precharge.

Referring to FIGS. 1, 2, 17 and 22, the scheduler 55 applies the first active command ACT1 to the semiconductor memory device 200 in synchronization with an edge of the clock signal CK_t, and applies the read command RDA that includes an auto precharge including a flag or the write command WRA that includes an auto precharge including a flag designating an internal read-update-write operation on the count data stored in a target memory cell designated by a target row address accompanied by the first active command ACT1 to the semiconductor memory device 200. In this case, the scheduler 55 may set the tenth command-address signal CA9 of the read command RDA including an auto precharge or the write command WRA including an auto precharge to a logic low level L for using the flag. The row hammer management circuit 500 may perform the internal read-update-write operation in response to the logic low level L of the tenth command-address signal CA9.

After a time interval corresponding to active to active time tRC from applying the first active command ACT1, the scheduler 55 applies a second active command ACT2 to the semiconductor memory device 200 and applies a refresh command REF to the semiconductor memory device 200. The semiconductor memory device 200 performs a hammer refresh operation on one or more victim memory cell rows physically adjacent to a memory cell row corresponding to the hammer address, in response to the refresh command REF.

In FIG. 22, the scheduler 55 may selectively apply the read command RDA including an auto precharge or the write command WRA including an auto precharge to the semiconductor memory device 200.

Figure 23A:
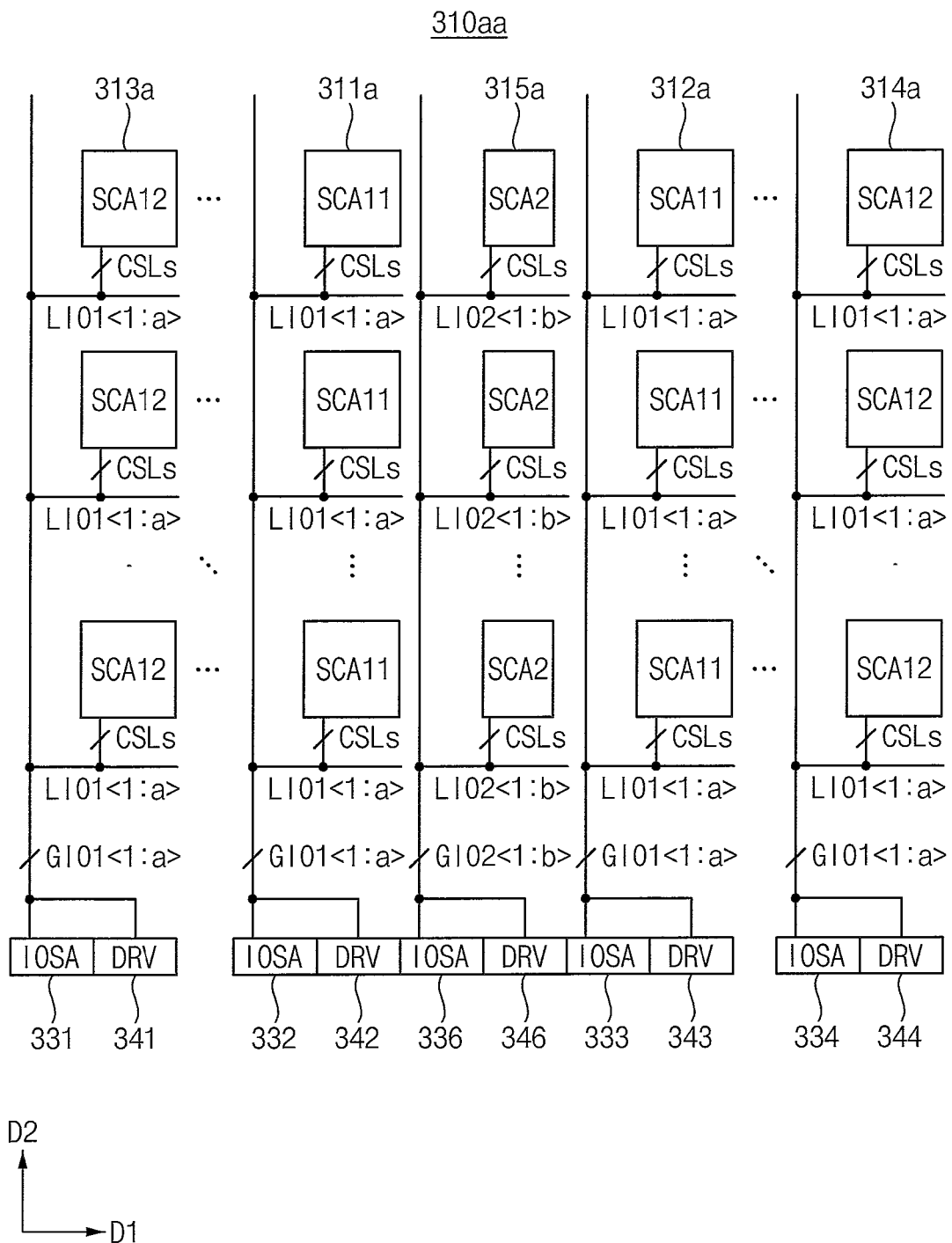
FIG. 23A is a block diagram illustrating an example of the first bank array in FIG. 3 according to example embodiments.

FIG. 23A is a block diagram illustrating an example of the first bank array in FIG. 3 according to example embodiments.

Referring to FIG. 23A, a first bank array 310aa may include first sub array blocks SCA11 311a and 312a, second sub array blocks SCA12 313a and 314a, third sub array blocks SCA2 315a, 110 sense amplifiers 331, 332, 333, 334 and 336 and drivers 341, 342, 343, 344 and 346.

Data I/O for each of the first sub array blocks 311a and 312a and the second sub array blocks 313a and 314a may be performed through first global I/O lines GIO1<1:a> and first local I/O lines LIO1<1:a>. Here, a may be a natural number equal to or greater than 8. Depending on a read command or a write command, "a" bit-lines of each of the first sub array blocks 311a and 312a and the second sub array blocks 313a and 314a disposed in the first direction D1 may be selected by a column select signal transmitted through one of column select lines CSLs.

The number of the first sub array blocks 311a and 312a and the second sub array blocks 313a and 314a may be different in other embodiments and, for example, may be determined depending on the number of bits of data the semiconductor memory device 200 is able to process.

Data I/O for the third sub array blocks 315a may be performed through second global I/O lines GIO2<1:b> and second local I/O lines LIO2<1:b>. Here, b may be a natural number smaller than a. Depending on a read command or a write command, "b" bit-lines of the third sub array blocks 315a may be selected by a column select signal that is transmitted through one of the column select lines CSLs. The number of the third sub array blocks 315a may be different in other embodiments.

In example embodiments, the first bank array 310aa may further include first sub array blocks, second sub array blocks and third sub array blocks disposed in the second direction D2.

In example embodiments, the first sub array blocks 311a and 312a may store normal data and the count data, the second sub array blocks 313a and 314a may store the normal data and the third sub array blocks 315a may store the parity data and the count parity data. The normal data may be, for example, data that the semiconductor memory device 200 receives from an external device or data that the semiconductor memory device 200 will provide to the external device.

The I/O sense amplifier 331 may sense and amplify voltages of the first global I/O lines GIO1<1:a>, which are determined depending on bits output through the first global I/O lines GIO1<1:a>. Each of the I/O sense amplifiers 332, 333, 334 and 336 may operate in a manner similar to the I/O sense amplifier 331. The I/O sense amplifier 336 may sense and amplify voltages of the second global I/O lines GIO2<1: b>, which are determined depending on bits output through the second global I/O lines GIO2<1:b>.

The driver 341 may provide data to memory cells of the first sub array blocks 313a through the first global I/O lines GIO1<1:a>, the first local I/O lines LIO1<1:a>, and "a" bit-lines selected by a column select signal transmitted through one of column select lines CSLs based on a write command. The data may include bits received through one data I/O pin, or may include bits received through a plurality of data I/O pins) aligned at a rising edge or a falling edge of a data strobe signal.

The drivers 342, 343, 344 and 346 may operate in a manner substantially similar to the driver 341. The driver 346 may transmit the parity data or the count parity data to memory cells of the third sub array blocks 315a through the second global I/O lines GIO2<1:b>, the second local I/O lines LIO2<1:b>, and "b" bit-lines selected by a column select signal transmitted through one of column select lines CSLs.

Figure 23B:
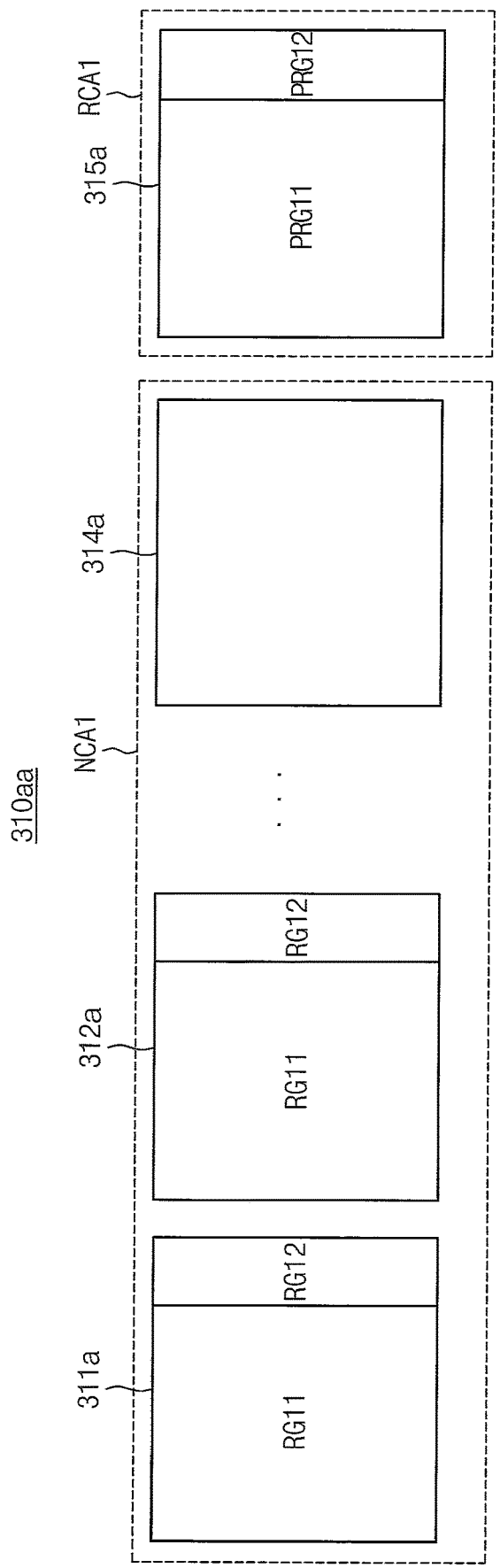
FIG. 23B is a block diagram illustrating the first bank array in FIG. 23A according to example embodiments.

FIG. 23B is a block diagram illustrating the first bank array in FIG. 23A according to example embodiments.

Referring to FIG. 23B, a normal cell region NCA1 may include the first sub array blocks 311a and 312a and the second sub array blocks 314a and a redundancy cell region RCA1 may include the third sub array block 315a.

Each of the first sub array blocks 311a and 312a may include a first region RG11 to store the normal data and a second region RG12 to store the count data and the third sub array block 315a may include a first region RG11 to store the count data and a second region RG12 to store the count parity data.

The control logic circuit 210 may assign a portion of the sub array blocks 311a, 312a, 314a and 315a except for the sub array block 315a to store the count data. The control logic circuit 210 may receive the result of testing write characteristic of memory cells of each of the plurality of memory cell rows from the BIST circuit 237 as the test information TI and may assign a portion of the sub array blocks 311a, 312a, 314a and 315a, with a shorter write time interval as the count cells.

Figure 24:
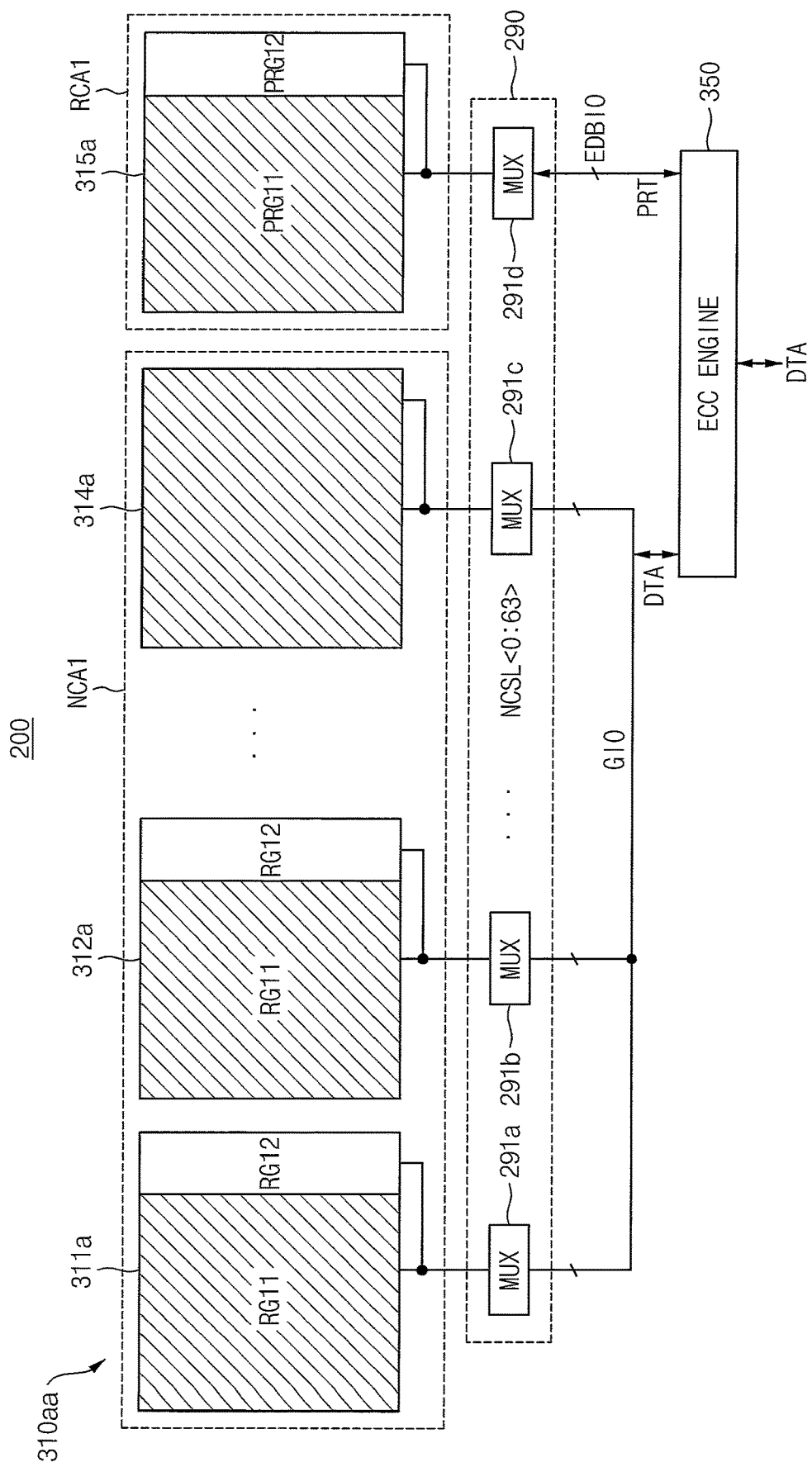
FIGS. 24 and 25 illustrate a portion of the semiconductor memory device of FIG. 3 respectively.
Figure 25:
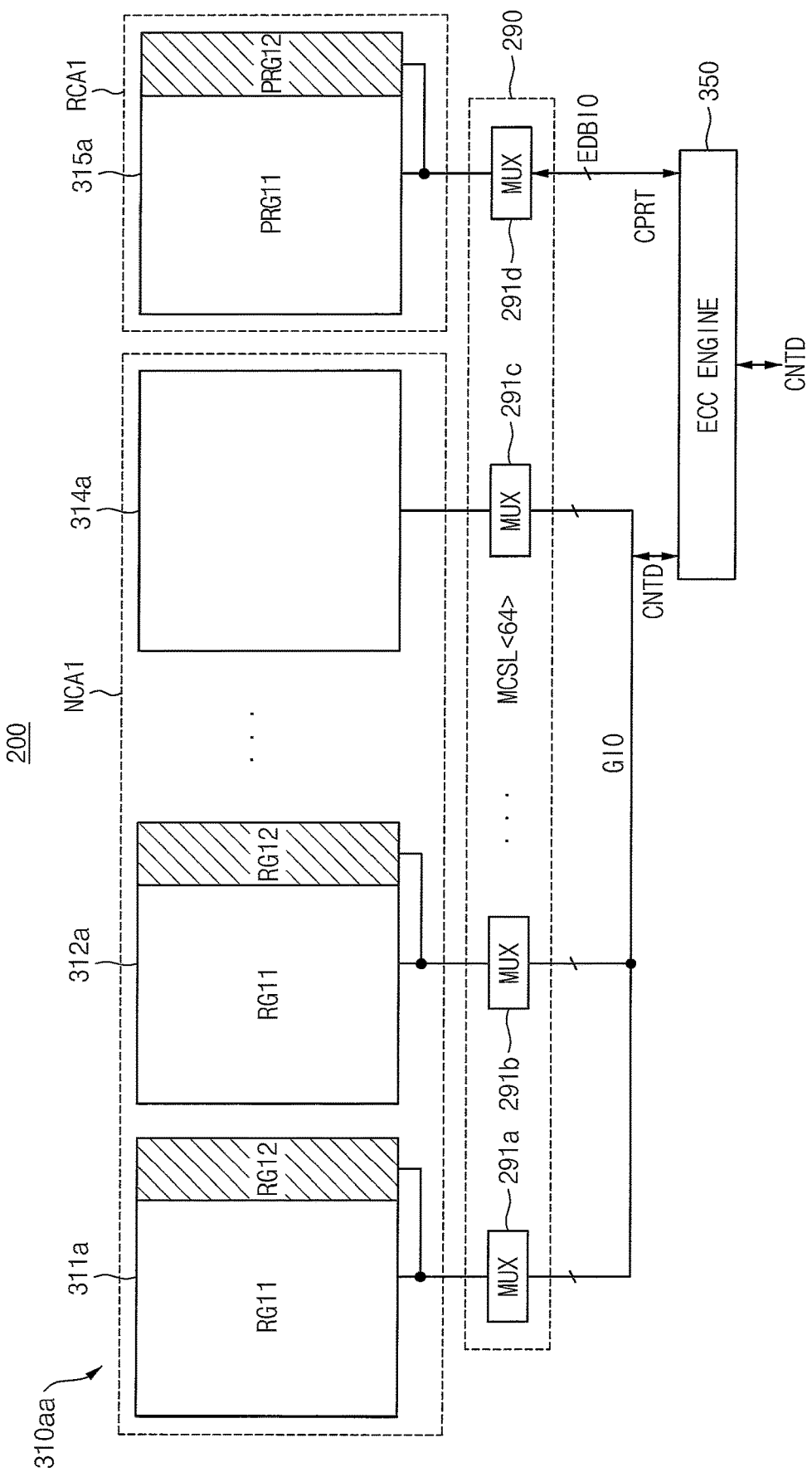

FIGS. 24 and 25 illustrate a portion of the semiconductor memory device 200 of FIGS. 1 and 3.

In each of FIGS. 24 and 25, the first bank array 310aa, the I/O gating circuit 290 and the ECC engine 350 are illustrated.

Referring to FIGS. 24 and 25, the first bank array 310aa includes a normal cell region NCA1 and a redundancy cell region RCA1. The normal cell region NCA1 includes a plurality of first memory blocks 311a~313a, and the redundancy cell region RCA1 includes at least a second memory block 315a. The first memory blocks 311a~313a and the second memory block 315a may each be representative of a sub array block SCB in FIG. 9.

In some examples, each of the memory blocks 311a and 312a from among the first memory blocks 311a~313a may include a first region RG11 and a second region RG12 and the second memory block 315a may include a first region PRG11 and a second region PRG12.

Referring to FIG. 24, in a normal write operation or in a normal read operation of the semiconductor memory device 200, the data DTA is written to or read from the first region RG11 in each of the first memory blocks 311a and 312a and the parity data PRT is written to or read from the first region PRG11 in the second memory block 314a using a normal column selection lines NCSL<0:63>.

Referring to FIG. 25, in a count data update operation of the semiconductor memory device 200, using an additional column selection line MCSL<64>, the count data CNTD is written to or read from the second region RG12 in a portion (e.g., first memory blocks 311a and 312a) of the first memory blocks 311a~313a and the count parity data CPRT is written to or read from the second region PRG12 in the second memory block 314a.

In FIGS. 24 and 25, the data DTA and the count data CNTD may be input/output to/from corresponding memory regions through the same global input/output line based on time multiplexing and an overhead may be minimized. In addition, the count data CNTD and the count parity data CPRT may be input/output to/from corresponding memory regions through the same global input/output line based on time multiplexing and an overhead may be minimized FIG. 26 is a diagram illustrating a portion of a memory cell array for describing generation of hammer refresh addresses.

Figure 26:
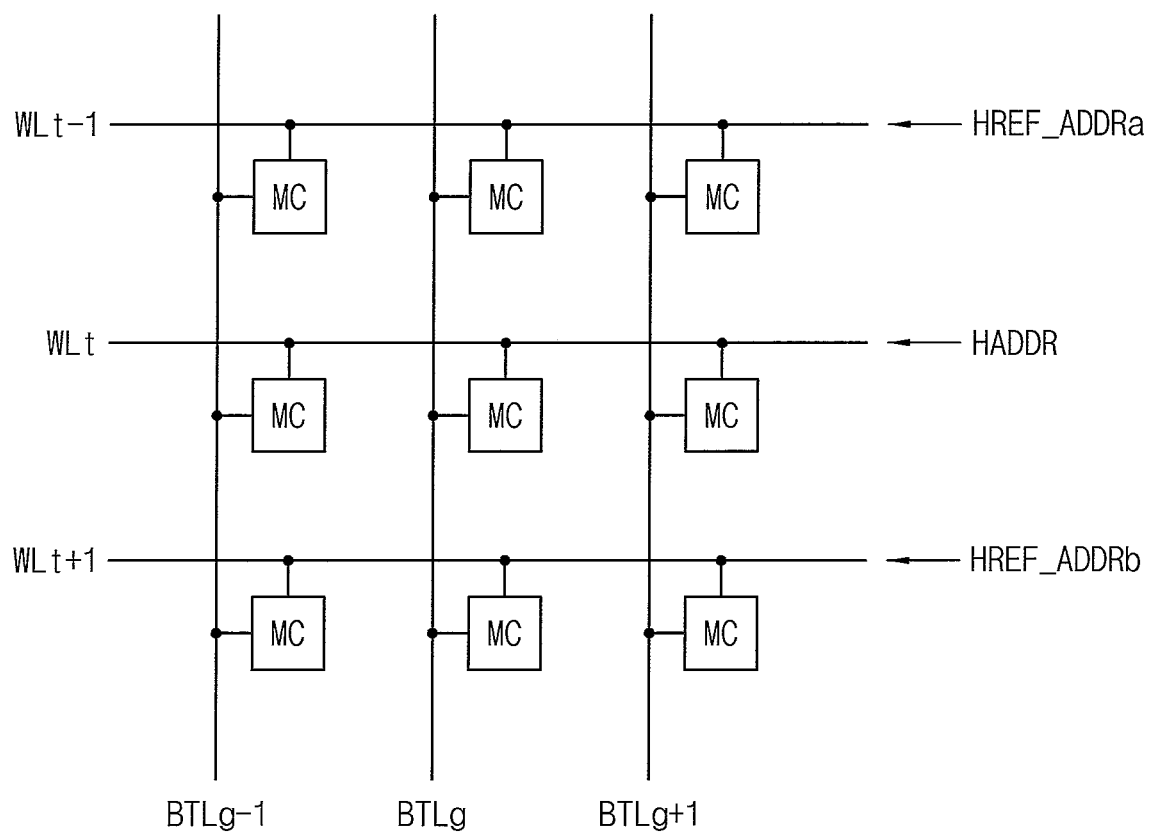
FIG. 26 is a diagram illustrating a portion of a memory cell array for describing generation of hammer refresh addresses.

FIG. 26 illustrates three word-lines WLt−1, WLt and WLt+1, three bit-lines BTLg−1, BTLg and BTLg+1 and memory cells MC coupled to the word-lines WLt−1, WLt and WLt+1 and the bit-lines BTLg−1, BTLg and BTLg+1 in the memory cell array. The three word-lines WLt−1, WLt and WLt+1 are extended in a row direction (i.e., D1 direction) and arranged sequentially along a column direction (i.e., D2 direction). The three bit-lines BTLg−1, BTLg and BTLg+1 are extended in the column direction and arranged sequentially along the row direction. It will be understood that the word-lines WLt−1 and WLt are physically directly adjacent to each other since there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer address generator 440 in FIG. 6 may provide the HREF_ADDR representing the addresses HREF_ADDRa and HREF_ADDRb of the rows (e.g., the word-lines WLt−1 and WLt+1) that are physically immediately adjacent to the row of the hammer address HADDR (e.g., the hammer word-line WLt), and an refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 27:
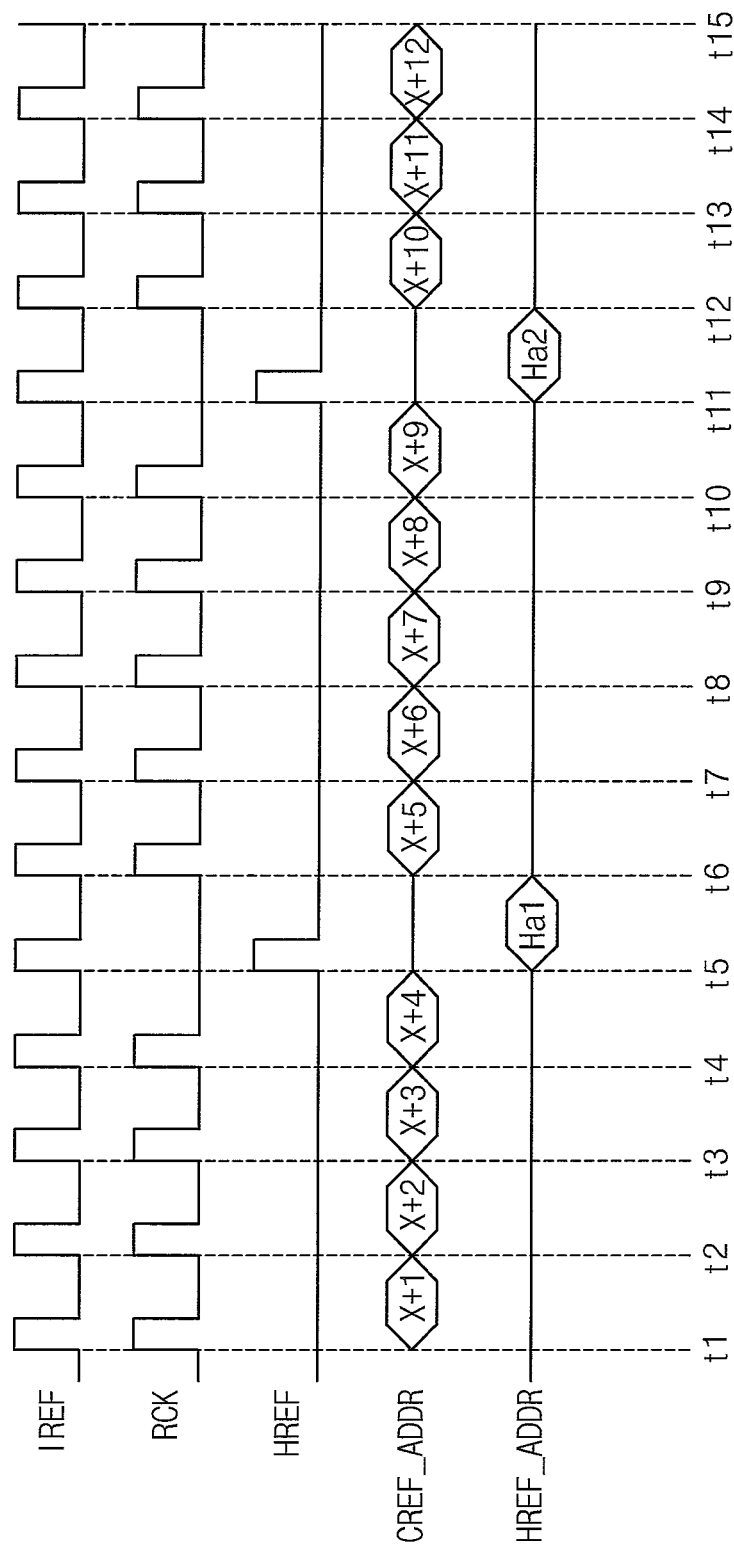
FIGS. 27 and 28 are timing diagrams illustrating example operations of a refresh control circuit of FIG. 6 according to example embodiments.
Figure 28:
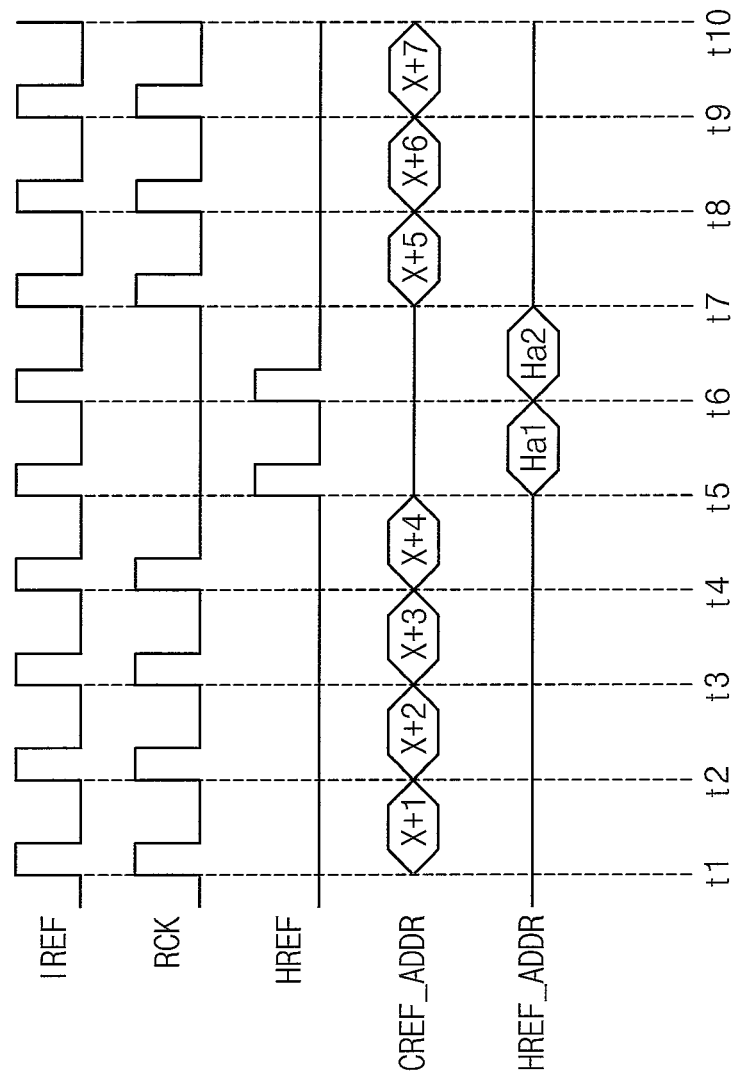

FIGS. 27 and 28 are timing diagrams illustrating example operations of a refresh control circuit of FIG. 6 according to example embodiments.

FIGS. 27 and 28 illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape. The intervals between the activation time points t1~t15 or between the activation time points t1~t10 of the refresh control signal IREF may be regular or irregular.

Referring to FIGS. 6 and 27, the refresh control logic circuit 410 may activate the refresh clock signal RCK in synchronization with some time points t1~t4, t6~t10 and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+15 in synchronization with the activation time points t1~t4, t6~t10 and t12~t15 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 6 and 28, the refresh control logic circuit 410 may activate the refresh clock signal RCK in synchronization with some time points t1~t4 and t7~t9 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t10 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Figure 29:
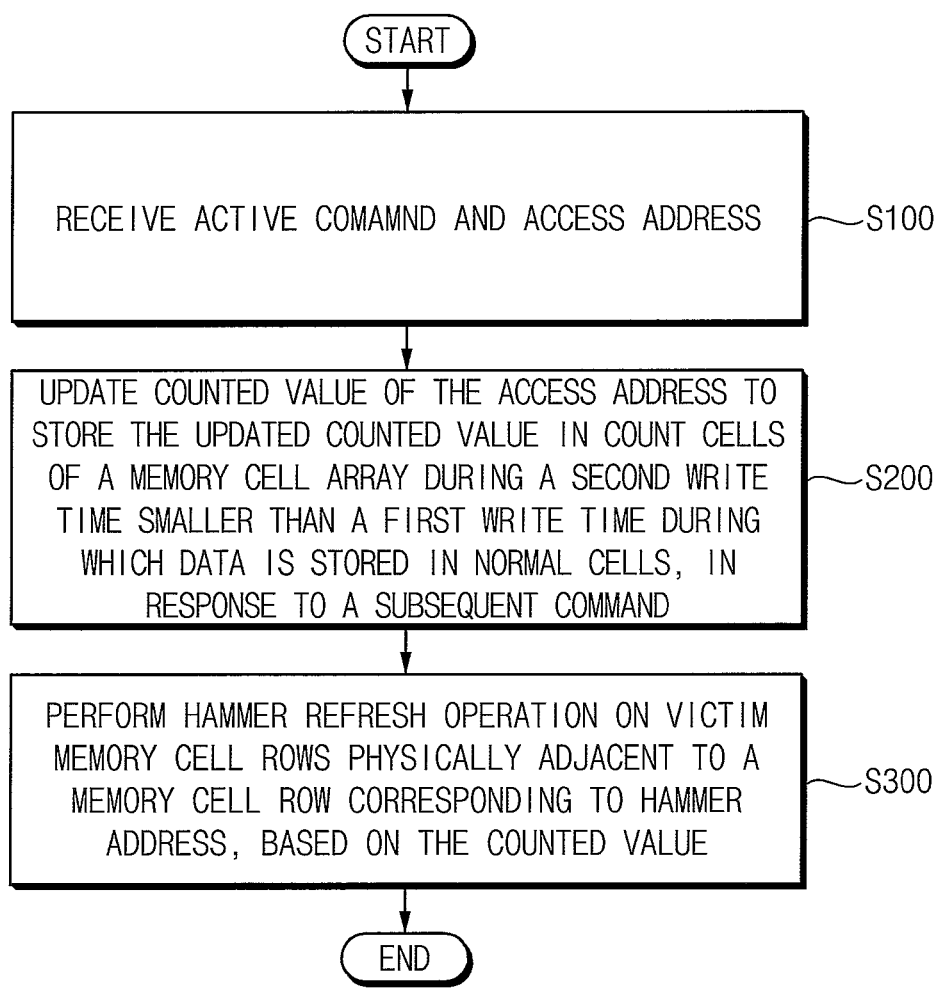
FIG. 29 is a flow chart illustrating an operation of the semiconductor memory device of FIG. 3 managing the hammer address according to example embodiments.

FIG. 29 is a flow chart illustrating an operation of the semiconductor memory device of FIG. 3 managing the hammer address according to example embodiments.

Referring to FIGS. 3 through 29, the semiconductor memory device 200 receives an active command and an access address accompanied by the active command (operation S100).

The semiconductor memory device 200 updates counted values of the access address stored in count cells of a target memory cell row designated by the access address in response to a subsequent command such as an active count update command or a precharge command while writing the updated counted values in the count cells during a second write time interval smaller than a first write time interval during which the semiconductor memory device 200 writes data in normal cells of the target memory cell row (operation S200). In example embodiments, the semiconductor memory device 200 updates counted values of the access address stored in a target memory cell row designated by the access address based on a read command including an auto precharge or a write command including an auto precharge which is selectively applied from the memory controller 30.

The semiconductor memory device 200 performs a hammer refresh operation on one or more victim memory cell rows physically adjacent to a memory cell row corresponding to the hammer address, based on the counted values read from the target memory cell row (operation S300).

Figure 30:
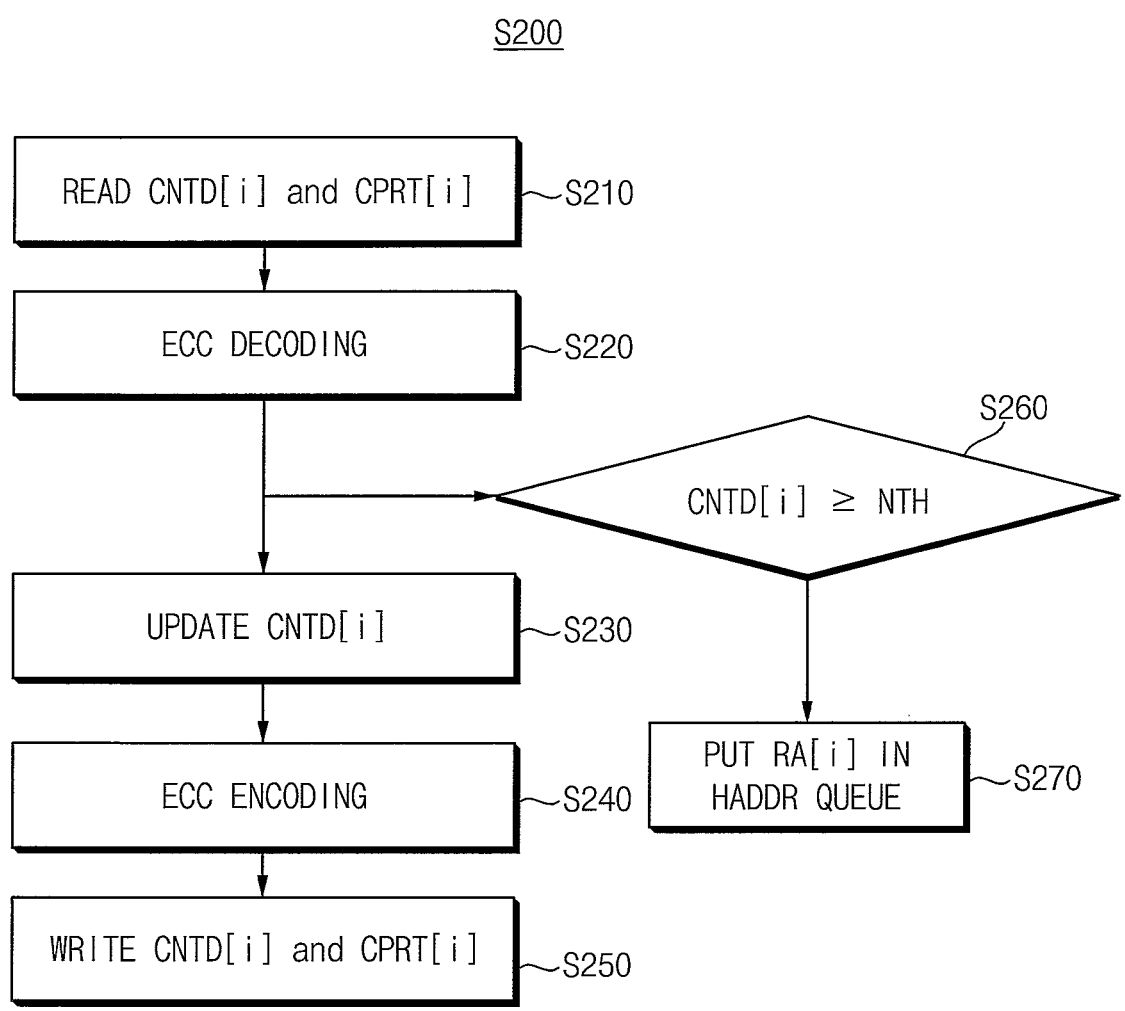
FIG. 30 is a flow chart illustrating operation of updating counted values in FIG. 29 according to example embodiments.

FIG. 30 is a flow chart illustrating operation of updating counted values in FIG. 29 according to example embodiments.

Referring to FIGS. 3 through 6, and 19 through 30, for updating the counted values (operation S200), the I/O gating circuit 290 reads a count data CNTD[i] and a count parity data CPRT[i] associated with the count data CNTD[i] from the count cells of the target memory cell row (S210) and provides the count data CNTD[i] and the count parity data CPRT[i] to the ECC engine 350.

The ECC engine 350 performs an ECC decoding operation on the count data CNTD[i] and the count parity data CPRT[i] to correct one or more error bit(s) in the count data CNTD[i] and provides the count data CNTD[i] as corrected count data to the row hammer management circuit 500 (operation S220).

The row hammer management circuit 500 updates the count data CNTD[i] by increasing bits of the count data CNTD[i] or by adding the count data CNTD[i] and the interval count data ICNT (operation S230) and provides the updated count data CNTD[i] to the ECC engine 350.

The ECC engine 350 performs an ECC encoding operation on the updated count data CNTD[i] to generate the count parity data CPRT[i] (operation S240) and the I/O gating circuit 290 writes the updated count data CNTD[i] and the count parity data CPRT[i] in the target memory cell row (operation S250).

When writing the updated count data CNTD[i] and the count parity data CPRT[i] in the target memory cell row, the control logic circuit 210 may perform the internal write operation during the second write time interval that is smaller than the first write time interval by performing at least two of performing a voltage boosting operation to increase at least one of a level and an activation interval of voltages associated with the internal write operation more than at least one of a level and an activation interval of voltages associated with the normal write operation; assigning memory cells with shorter write time from among the memory cells of each of the memory cell row as the count cells based on a result of a testing write characteristic of the memory cells of each of the plurality of memory cell rows by unit of column selection line; and configuring the ECC engine 350 such that a first ratio of bits of parity data based on the data to bits of the data is smaller than a second ratio of bits of count parity data based on the count data to bits of the count data. When the second ratio of bits of count parity data to bits of the count data is higher than the first ratio of bits of parity data to bits of the data, and when the count data is written in the count cells during the second write time interval smaller than the first write time interval, errors due to the second write time interval may be corrected by using higher ratio of bits of count parity data to bits of the count data.

The row hammer management circuit 500 determines whether the count data CNTD[i] is equal to or greater than a reference number NTH (operation S260). When the count data CNTD[i] is equal to or greater than a reference number NTH (YES in operation S260), the row hammer management circuit 500 stores a row address RA[i] of the target memory cell row in the hammer address queue 530 (operation S270). The row hammer management circuit 500 may provide the refresh control circuit 400 with the row address RA[i] stored in the hammer address queue 530 as the hammer address HADDR.

Therefore, the semiconductor memory device according to example embodiments, may store active count of each of a plurality of memory cell rows in count cells of each of the plurality of memory cell rows as the count data, and may update the count data based on a subsequent command which is applied after the active command while writing the updated counted values in the count cells during a second write time interval smaller than a first write time interval during which the semiconductor memory device writes data in normal cells of the target memory cell row. Therefore, the semiconductor memory device and the memory system may manage row hammer of all of the memory cell rows with maintaining performance.

In addition, because the user data and the count data are input/output through the same global input/output lines based on time multiplexing (e.g., processed in sequence), and the ECC engine performs ECC encoding operation and ECC decoding operation on the user data and the count data based on time multiplexing, overhead may be reduced.

Figure 31:
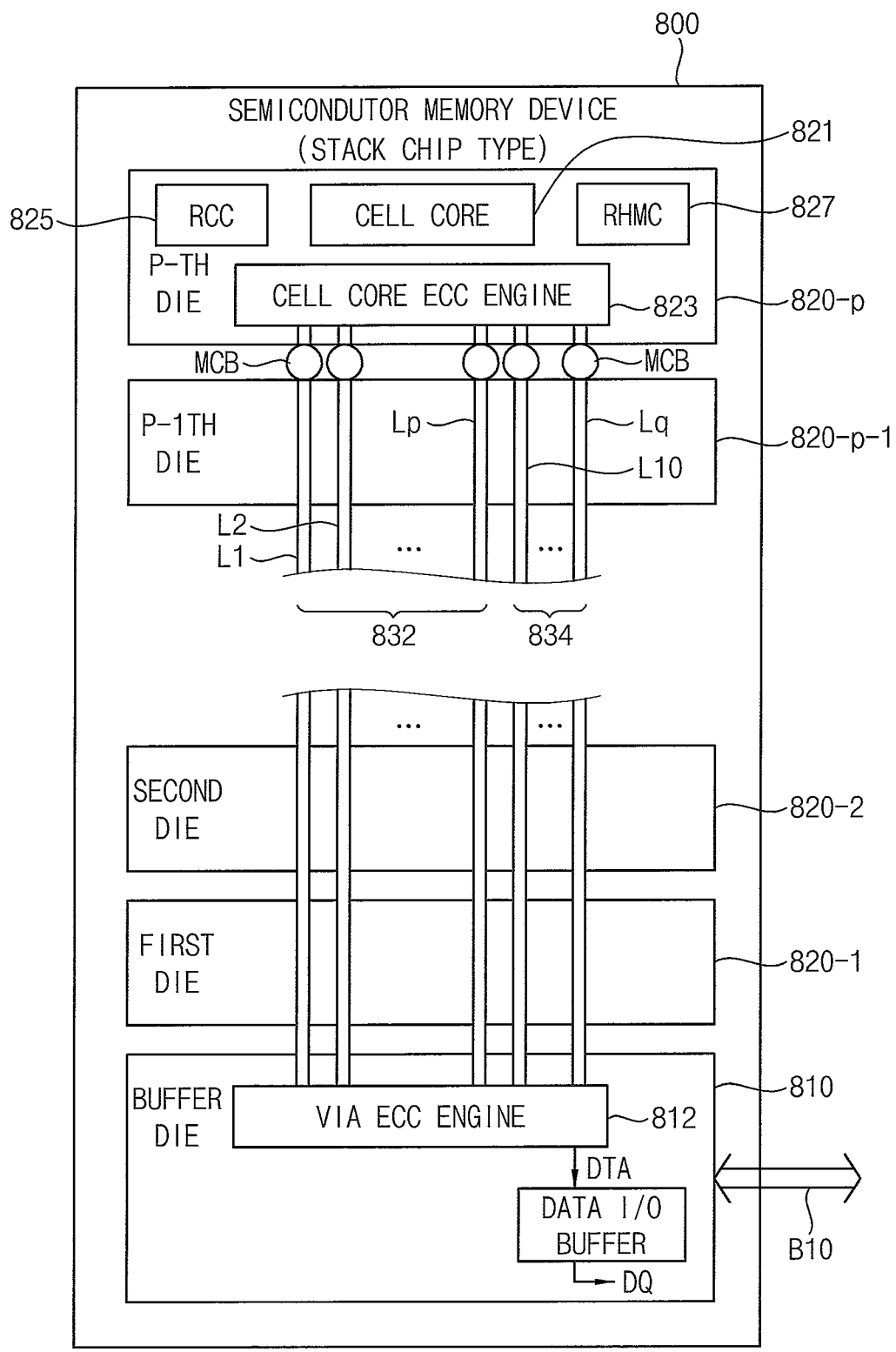
FIG. 31 is a block diagram illustrating a semiconductor memory device according to example embodiments.

FIG. 31 is a block diagram illustrating a semiconductor memory device according to example embodiments.

Referring to FIG. 31, a semiconductor memory device 800 may include at least one buffer die 810 and a plurality of memory dies 820-1 to 820-$p$ ($p$ is a natural number equal to or greater than three) providing a soft error analyzing and correcting function in a stacked chip structure.

The plurality of memory dies (semiconductor chips) 820-1 to 820-$p$ are stacked on the buffer die 810 and conveys data through a plurality of through silicon via (TSV) lines.

At least one of the memory dies 820-1 to 820-$p$ may include a cell core 821 to store data, a cell core ECC engine 823 which generates transmission parity bits (i.e., transmission parity data) based on transmission data to be sent to the at least one buffer die 810, a refresh control circuit (RCC) 825 and a row hammer management circuit (RHMC) 827. The cell core 821 may include a plurality of memory cells having DRAM cell structure.

The refresh control circuit 825 may employ the refresh control circuit 400 of FIG. 6 and the row hammer management circuit 827 may employ the row hammer management circuit 500a of FIG. 5A or the row hammer management circuit 500b of FIG. 5B. The row hammer management circuit 827 may store the active counts of each of a plurality of memory cell rows in count cells of each of the plurality of memory cell rows (e.g., in the first region RG21) as count data, may update the count data based on a subsequent command which is applied after the active command while performing an internal write operation to write the count data in the count cells during a second write time interval smaller than a first write time interval associated with performing a normal write operation to write (normal) data in normal cells, and thus may manage row hammer of all of the memory cell rows. The refresh control circuit 825 may receive a hammer address from the row hammer management circuit 827 and may perform hammer refresh operations on one or more victim memory cell rows physically adjacent to a memory cell row corresponding to the hammer address.

The buffer die 810 may include a via ECC engine 812 which corrects a transmission error using the transmission parity bits when a transmission error is detected from the transmission data received through the TSV lines and generates error-corrected data.

The buffer die 810 may further include a data I/O buffer 816. The data I/O buffer 816 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be formed by interconnecting corresponding TSVs ("through substrate vias" that extend through the substrates (which may include extending through the entire dies) of the dies 810, 820 and also may be called 'through electrodes'.

The cell core ECC engine 823 may perform error correction on data which is outputted from the memory die 820-$p$ before the transmission data is sent.

A data TSV line group 832 which is formed at one memory die 820-$p$ may include 128 TSV lines L1 and L2 to Lp, and a parity TSV line group 834 may include 8 TSV lines L10 to Lq. The TSV lines L1 and L2 to Lp of the data TSV line group 832 and the parity TSV lines L10 to Lq of the parity TSV line group 834 may be connected to micro bumps MCB which are correspondingly formed among the memory dies 820-1 to 820-$p$.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 31, the cell core ECC engine 823 may be included in the memory die 820-$p$, the via ECC engine 812 may be included in the buffer die 810. Accordingly, it may be possible to detect and correct soft data failures.

The soft data fail may include faulty bits occurring from a transmission error which is generated due to noise when data is transmitted through TSV lines.

Figure 32:
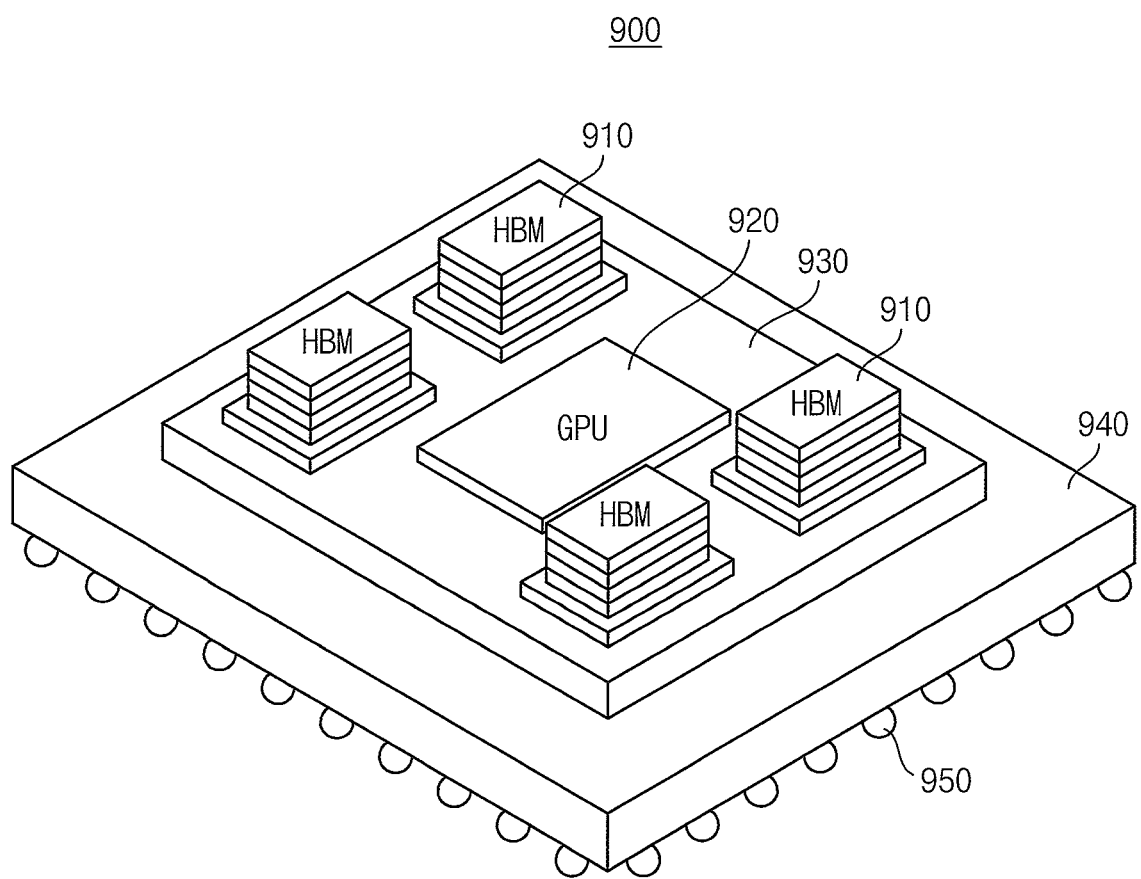
FIG. 32 is a configuration diagram illustrating a semiconductor package including the stacked memory device according to example embodiments.

FIG. 32 is a configuration diagram illustrating a semiconductor package including the stacked memory device according to example embodiments.

Referring to FIG. 32, a semiconductor package 900 may include one or more stacked memory devices 910 and a graphic processing unit (GPU) 920. Each stacked memory device 910 may formed as a semiconductor memory device 800 (including structure and operation) as described herein.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP). The GPU 920 may include a memory controller (e.g., such as memory controller 30 described herein) having a scheduler.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies include a refresh control circuit and a row hammer management circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. In addition, when the stacked memory device 910 includes a direct access region, a test signal may be provided into the stacked memory device 910 through conductive means (e.g., solder balls 950) mounted under package substrate 940 and the direct access region.

Aspects of the present inventive concept may be applied to systems using semiconductor memory devices that employ volatile memory cells, such as DRAM memory cells. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
    a memory cell array including a plurality of memory cell rows, each including a plurality of memory cells;
    a row hammer management circuit configured to:
        for each of the plurality of memory cell rows, count a number of instances of access and to store corresponding counted values in count cells of each of the plurality of memory cell rows as count data, and
        initiate an internal read-update-write operation to read the count data from the count cells of a target memory cell row from among the plurality of memory cell rows, to update the read count data, and to write the updated count data in the count cells of the target memory cell row; and
    a control logic circuit configured to:
        perform a normal write operation to write data in a first group of cells in a first memory cell row of the plurality of memory cell rows during a first write time interval, and
        perform, as an operation of the internal read-update-write operation, an internal write operation to write the updated count data in the count cells during a second write time interval smaller than the first write time interval,
    wherein the normal write operation is initiated based on a first internal write command and the internal write operation is initiated based on a second internal write command, and
    wherein the first write time interval is initiated based on the first internal write command and the second write time interval is initiated based on the second internal write command.

2. The semiconductor memory device of claim 1, wherein the control logic circuit is configured to perform a voltage boosting operation to increase at least one of a level and an activation interval of voltages associated with the internal write operation to be more than the corresponding one of a level and an activation interval of voltages associated with the normal write operation.

3. The semiconductor memory device of claim 1, further comprising:
    first bit-line sense amplifiers connected to the first group of cells;
    first local sense amplifier circuits connected to the first bit-line sense amplifiers through first local input/output (I/O) lines;
    second bit-line sense amplifiers connected to the count cells;
    second local sense amplifier circuits connected to the second bit-line sense amplifiers through second local I/O lines; and
    a driver connected to the first local sense amplifier circuits and the second local sense amplifier circuits through global I/O lines.

4. The semiconductor memory device of claim 3, wherein the control logic circuit is configured to:
    provide a first group of voltages to the first bit-line sense amplifiers, the first local sense amplifier circuits and the driver in the normal write operation,
    provide a second group of voltages to the second bit-line sense amplifiers, the second local sense amplifier circuits and the driver in the internal write operation, and
    control the normal write operation and the internal write operation such that at least one of a level and an activation interval of the second group of voltages is greater than at least one of a level and an activation interval of the first group of voltages.

5. The semiconductor memory device of claim 1, further comprising:
    an error correction code (ECC) engine configured to:
    perform a first ECC encoding operation on the data to generate first parity data and perform a second ECC encoding on the count data to generate count parity data,
    wherein the memory cell array includes:
    a normal cell region including the first group of cells to store the data and the count cells to store the count data; and
    a parity cell region configured to store the count parity data,
    wherein the control logic circuit is configured to control the ECC engine such that a first ratio of the number of bits of the first parity data to the number of bits of the data is smaller than a second ratio of the number of bits of the count parity data to the number of bits of the count data.

6. The semiconductor memory device of claim 5, wherein the ECC engine includes:
    an ECC encoder configured to generate the first parity data and the count parity data; and
    an ECC decoder configured to:
        perform a first ECC decoding on the data and the first parity data to correct up to a maximum of a first number of error bits in a read operation on the data, and
        perform a second ECC decoding on the count data and the count parity data to correct up to a maximum of a second number of error bits in the count data in a read operation on the count data,
    wherein the ratio of the second number to the number of bits of count data is greater than the ratio of the first number to the number of data bits.

7. The semiconductor memory device of claim 5, wherein:
    the normal cell region includes a plurality of sub array blocks arranged in a two dimensional array, each of the plurality of sub array blocks including a corresponding portion of the plurality of memory cells, and a corresponding portion of the count cells.

8. The semiconductor memory device of claim 1, further comprising:
    a built-in self-test (BIST) circuit configured to test write characteristic of memory cells of each of the plurality of memory cell rows by a unit of column selection lines,
    wherein the control logic circuit is configured to assign memory cells with a shorter write time from among the memory cells as the count cells based on a result of the test of the BIST circuit.

9. The semiconductor memory device of claim 8, wherein:
    wherein the memory cell array includes a normal cell region including the first group of cells to store the data and the count cells to store the count data,
    wherein the normal cell region includes a plurality of sub array blocks arranged in a two dimensional array, each of the plurality of sub array blocks including a corresponding portion of the plurality of memory cells, and
    wherein the control logic circuit is configured to assign the count cells in a portion of the plurality of sub array blocks.

10. The semiconductor memory device of claim 1,
    wherein the row hammer management circuit is configured to determine a hammer address associated with at least one of the plurality of memory cell rows, which is intensively accessed more than a predetermined reference number of times, based on the counted values and is configured to output the hammer address,
    wherein the semiconductor memory device further comprises:
    a refresh control circuit configured to receive the hammer address and to perform a hammer refresh operation on one or more victim memory cell rows which are physically adjacent to a memory cell row identified by the hammer address.

11. The semiconductor memory device of claim 10, wherein the refresh control circuit includes:
    a refresh control logic circuit configured to generate a hammer refresh signal in response to a hammer event detection signal associated with the hammer address;
    a refresh clock generator configured to generate a refresh clock signal in response to a refresh signal;
    a refresh counter configured to generate a counter refresh address associated with a normal refresh operation on the plurality of memory cell rows;
    hammer address storage configured to store the hammer address and to output the hammer address in response to the hammer refresh signal; and
    a mapper configured to generate hammer refresh addresses designating addresses of the one or more victim memory cell rows based on the hammer address output from the hammer address storage.

12. The semiconductor memory device of claim 1, wherein the row hammer management circuit is configured to initiate the internal read-update-write operation in response to a first command from an external memory controller applied after a second command from the external memory controller that is associated with a memory operation on the target memory cell row.

13. The semiconductor memory device of claim 12,
    wherein the second command is one of a read command designating a read operation on the target memory cell row or a write command designating a write operation on the target memory cell row, and wherein the first command is an active count update command which is applied from the external memory controller.

14. The semiconductor memory device of claim 10, wherein the row hammer management circuit includes:
an adder configured to update the read count data from the target memory cell row to output the updated count data;
a comparator configured to compare one of the read count data and the updated count data with the predetermined reference number of times to output a comparison signal; and
a hammer address queue configured to:
store a target access address designating the target memory cell row in response to the comparison signal indicating that the read count data is equal to or greater than the predetermined reference number of times, and
provide the refresh control circuit with the target access address as the hammer address.

15. A semiconductor memory device comprising:
a memory cell array including a plurality of memory cell rows, each including a plurality of memory cells;
a row hammer management circuit configured to:
for each of the plurality of memory cell rows, count a number of instances of access and to store corresponding counted values in count cells of each of the plurality of memory cell rows as count data, and
in response to a flag received with a first command, initiate an internal read-update-write operation to read the count data from the count cells of a target memory cell row from among the plurality of memory cell rows, to update the read count data, and to write the updated count data in the count cells of the target memory cell row; and
a control logic circuit configured to:
perform a normal write operation to write data in a first group of cells in a first memory cell row of the plurality of memory cell rows during a first write time interval, and
perform, as an operation of the read-update-write operation, an internal write operation to write the updated count data in the count cells during a second write time interval smaller than the first write time interval,
wherein the first write time interval corresponds to a time interval between an issuance of the first internal write command and an issuance of an immediately subsequent internal command, and
wherein the second time interval corresponds to a time interval between an issuance of a second internal write command and an issuance of an immediately subsequent internal command.

16. The semiconductor memory device of claim 15, wherein the row hammer management circuit is configured to initiate the internal read-update-write operation in response to the flag received with the first command applied after a second command for a memory operation on the target memory cell row is received from an external memory controller after receipt of an active command.

17. The semiconductor memory device of claim 16, wherein the second command is one of a read command designating a read operation on the target memory cell row or a write command designating a write operation on the target memory cell row, and wherein the first command is a precharge command designating a precharge operation on the target memory cell row.

18. The semiconductor memory device of claim 17, wherein the row hammer management circuit is configured to initiate the internal read-update-write operation:
based on a chip selection signal having a logic low level, and
using one or a plurality of command/address signals of the precharge command as the flag.

19. The semiconductor memory device of claim 15, wherein the row hammer management circuit is configured to initiate the internal read-update-write operation in response to the flag received with the first command that is selectively applied from an external memory controller after receipt of an active command,
wherein the first command is a memory operation command on the target memory cell row, and
wherein the first command is either a read command including an auto precharge or a write command including an auto precharge.

20. A semiconductor memory device comprising:
a memory cell array including a plurality of memory cell rows, each including a plurality of memory cells;
a row hammer management circuit configured to:
for each of the plurality of memory cell rows, count a number of instances of access and to store corresponding counted values in count cells of each of the plurality of memory cell rows as count data, and
initiate an internal read-update-write operation to read the count data from the count cells of a target memory cell row from among the plurality of memory cell rows, to update the read count data, and to write the updated count data in the count cells of the target memory cell row; and
a control logic circuit configured to:
perform a normal write operation to write data in a first group of cells in a first memory cell row of the plurality of memory cell rows during a first write time interval, and
perform, as an operation of the read-update-write operation, an internal write operation to write the updated count data in the count cells during a second write time interval smaller than the first write time interval,
wherein the normal write operation is initiated based on a first internal write command and the internal write operation is initiated based on a second internal write command,
wherein the first write time interval is initiated based on the first internal write command and the second write time interval is initiated based on the second internal write command, and
wherein the control logic circuit is configured to perform the internal read-update-write operation during the second write time interval by performing at least two of:
performing a voltage boosting operation to increase at least one of a level and an activation interval of voltages associated with the internal write operation to be more than the corresponding one of a level and an activation interval of voltages associated with the normal write operation;
assigning memory cells with a shorter write time from among the memory cells of each of the memory cell row as the count cells based on a result of a testing write characteristic of the memory cells of each of the plurality of memory cell rows; and controlling an ECC engine such that a first ratio of the number of bits of first parity data based on the data to the number bits of the data is smaller than a second ratio of the number of bits of count parity data based on the count data to the number of bits of the count data.

* * * * *